US008796742B1

(12) United States Patent  
Chang et al.

(10) Patent No.: US 8,796,742 B1  
(45) Date of Patent: Aug. 5, 2014

(54) NON-REPLACEMENT GATE NANOMESH FIELD EFFECT TRANSISTOR WITH EPITIXIALLY GROWN SOURCE AND DRAIN

(71) Applicant: International Business Machines Corporation, Armonk, NY (US)

(72) Inventors: Josephine B. Chang, Mahopac, NY (US); Paul Chang, Mahopac, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/022,735

(22) Filed: Sep. 10, 2013

Related U.S. Application Data

(63) Continuation of application No. 13/796,418, filed on Mar. 12, 2013.

(51) Int. Cl.
| | | |
|---|---|---|
| *H01L 29/745* | (2006.01) | |
| *H01L 29/74* | (2006.01) | |
| *H01L 21/336* | (2006.01) | |

(52) U.S. Cl.  
USPC ........... 257/213; 257/224; 257/229; 438/300; 438/303; 438/479

(58) Field of Classification Search  
USPC .......... 438/279, 300, 303, 479; 257/213, 217, 257/224, 229, 243, 288  
See application file for complete search history.

(56) References Cited

U.S. PATENT DOCUMENTS

| | | |
|---|---|---|
| 7,893,492 B2 | 2/2011 | Bedell et al. |
| 8,242,485 B2 | 8/2012 | Chang et al. |
| 2008/0014689 A1 | 1/2008 | Cleavelin et al. |
| 2011/0233522 A1 | 9/2011 | Cohen et al. |
| 2011/0278539 A1 | 11/2011 | Bangsaruntip et al. |
| 2011/0309332 A1 | 12/2011 | Chang et al. |
| 2012/0007051 A1* | 1/2012 | Bangsaruntip et al. ......... 257/24 |
| 2012/0138886 A1 | 6/2012 | Kuhn et al. |
| 2012/0168872 A1 | 7/2012 | Chang et al. |

OTHER PUBLICATIONS

Office Action dated Dec. 4, 2013 received in a related U.S. Patent Application, namely U.S. Appl. No. 13/796,418.

* cited by examiner

*Primary Examiner* — Hsien Ming Lee  
(74) *Attorney, Agent, or Firm* — Scully, Scott, Murphy & Presser, P.C.; Louis J. Percello, Esq.

(57) ABSTRACT

An alternating stack of two different semiconductor materials is patterned to include two pad regions and nanowire regions. A semiconductor material is laterally etched selective to another semiconductor material to form a nanomesh including suspended semiconductor nanowires. Gate dielectrics, a gate electrode, and a gate cap dielectric are formed over the nanomesh. A dielectric spacer is formed around the gate electrode. The semiconductor materials in the two pad regions and physically exposed portions of the nanomesh are removed employing the dielectric spacer and the gate cap dielectric as an etch mask. A source region and a drain region are epitaxially grown from end surfaces of the nanomesh.

20 Claims, 26 Drawing Sheets

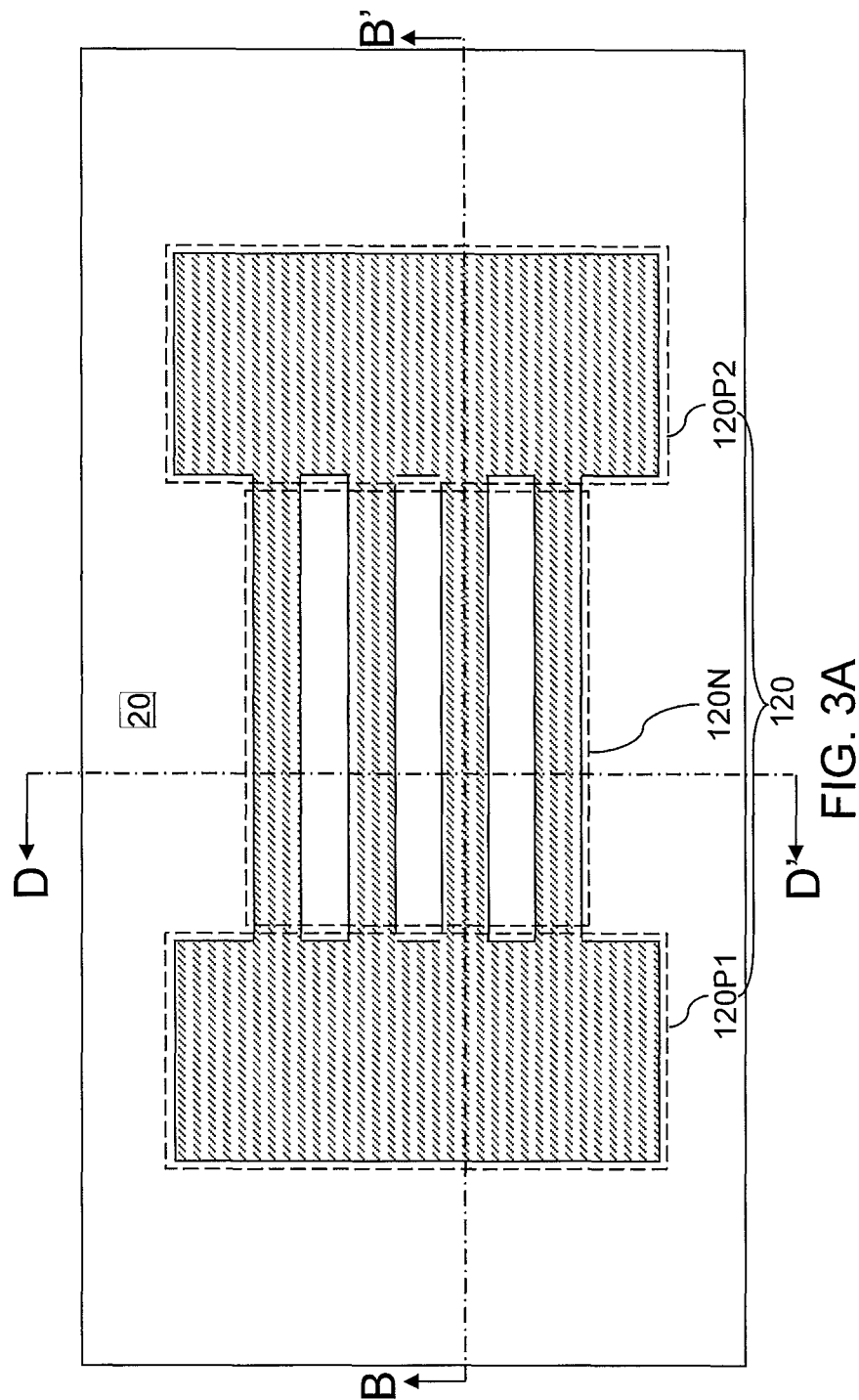

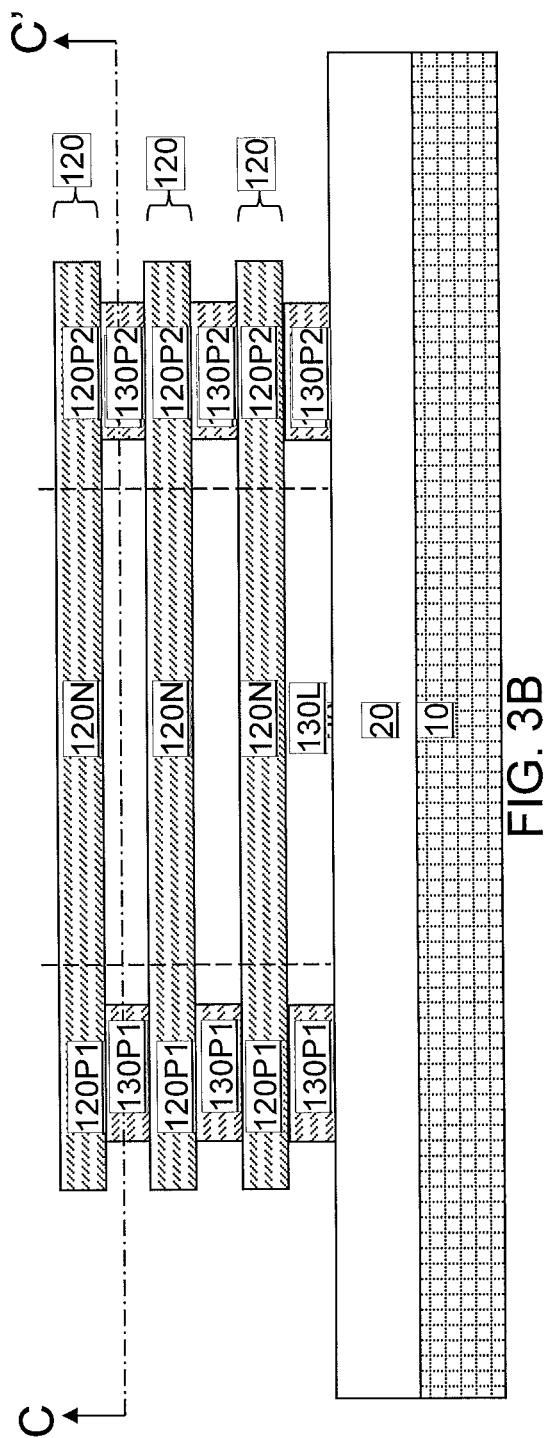

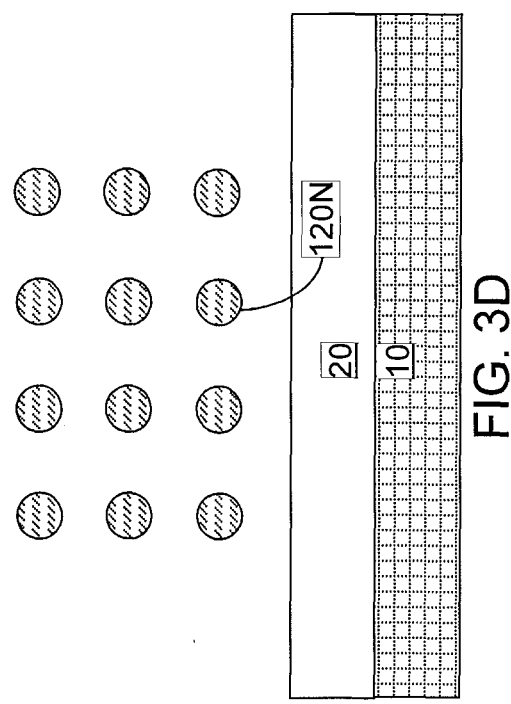

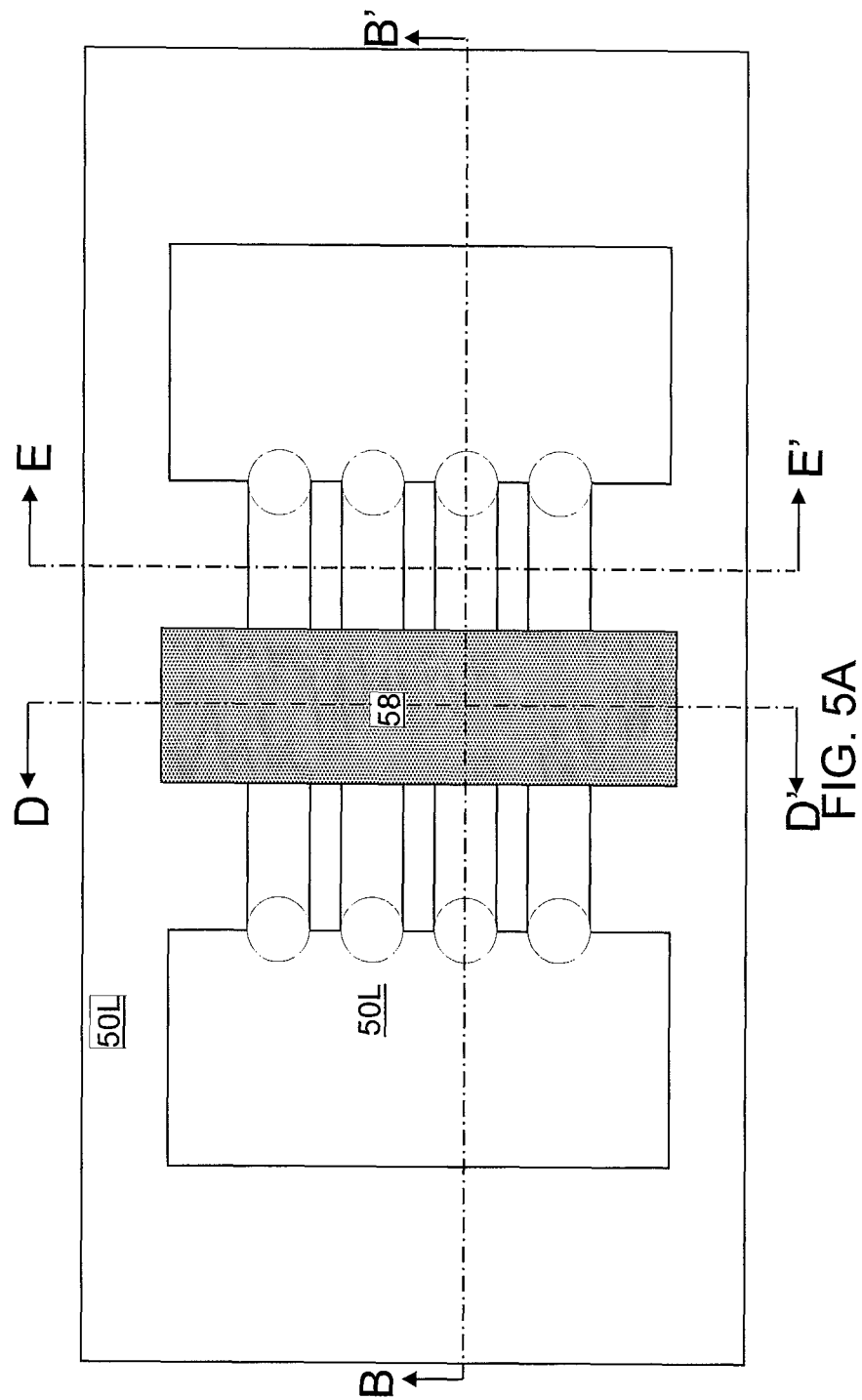

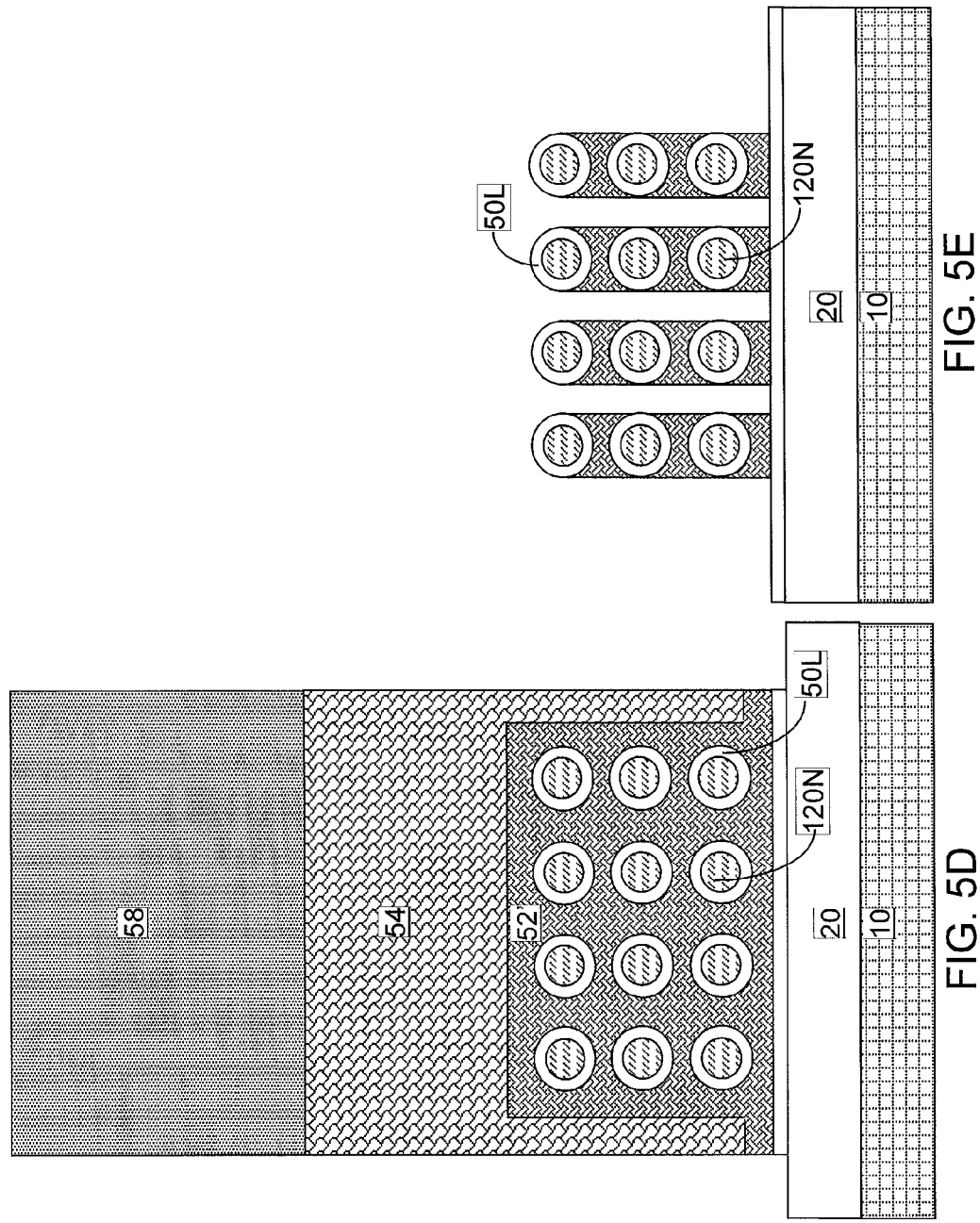

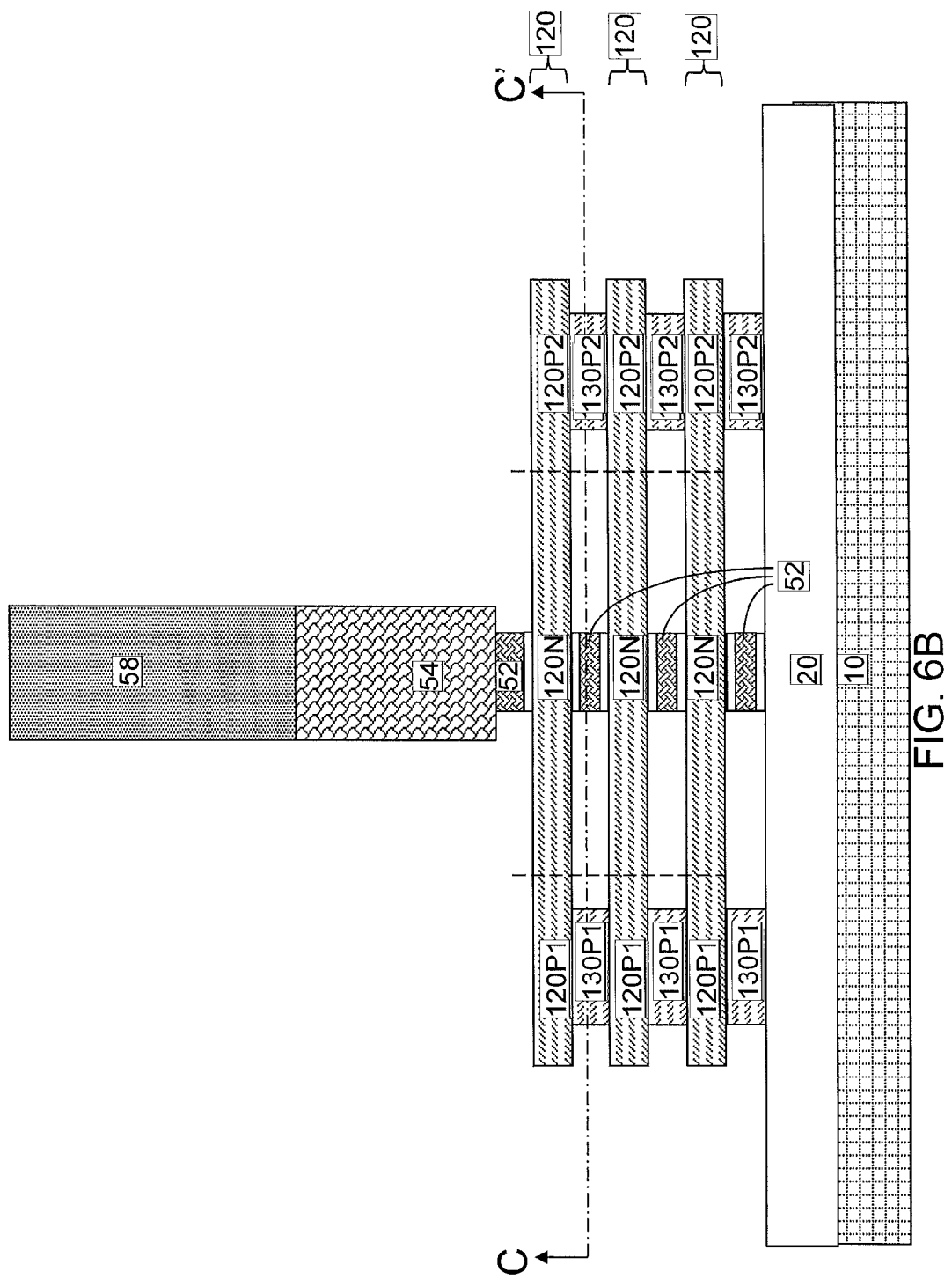

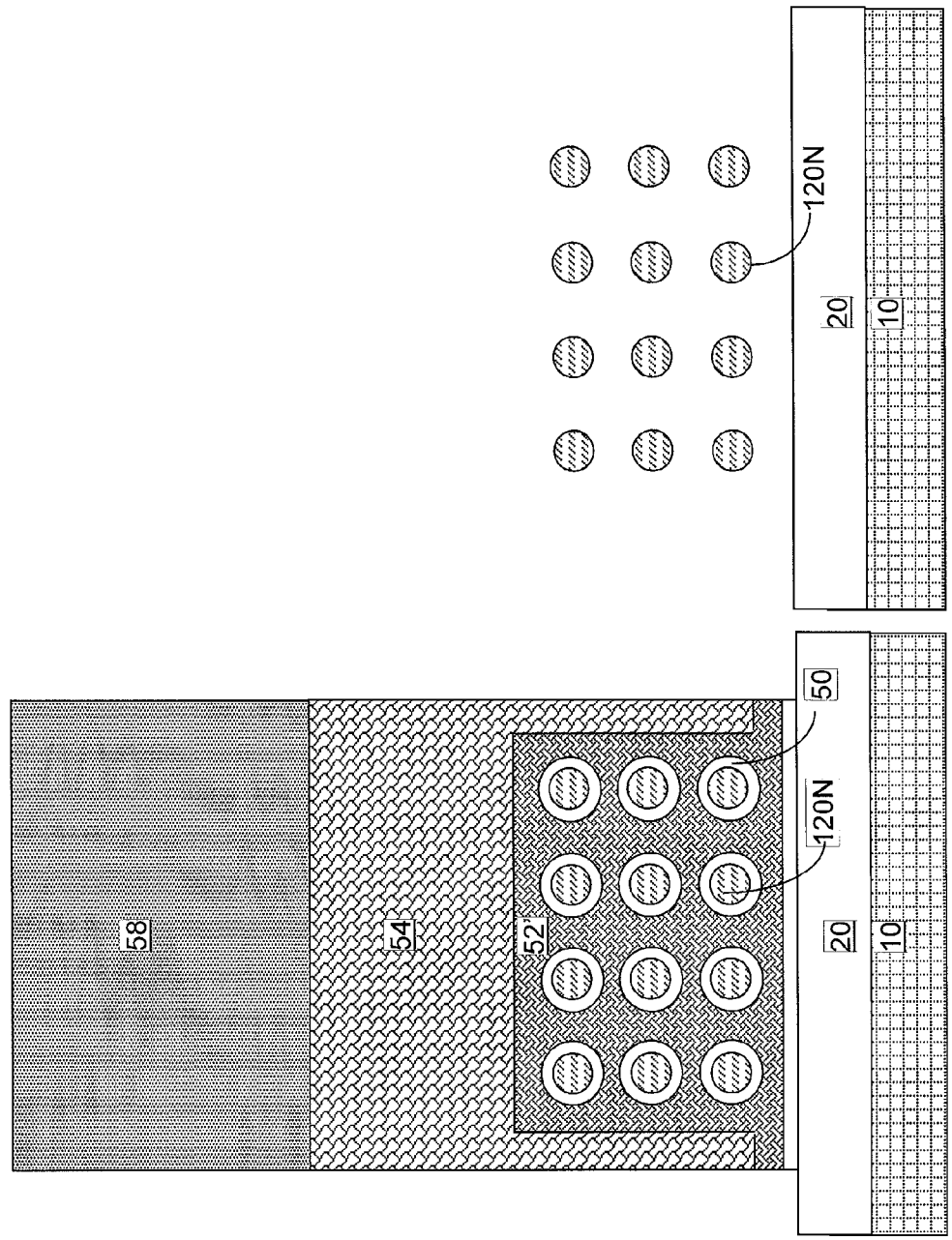

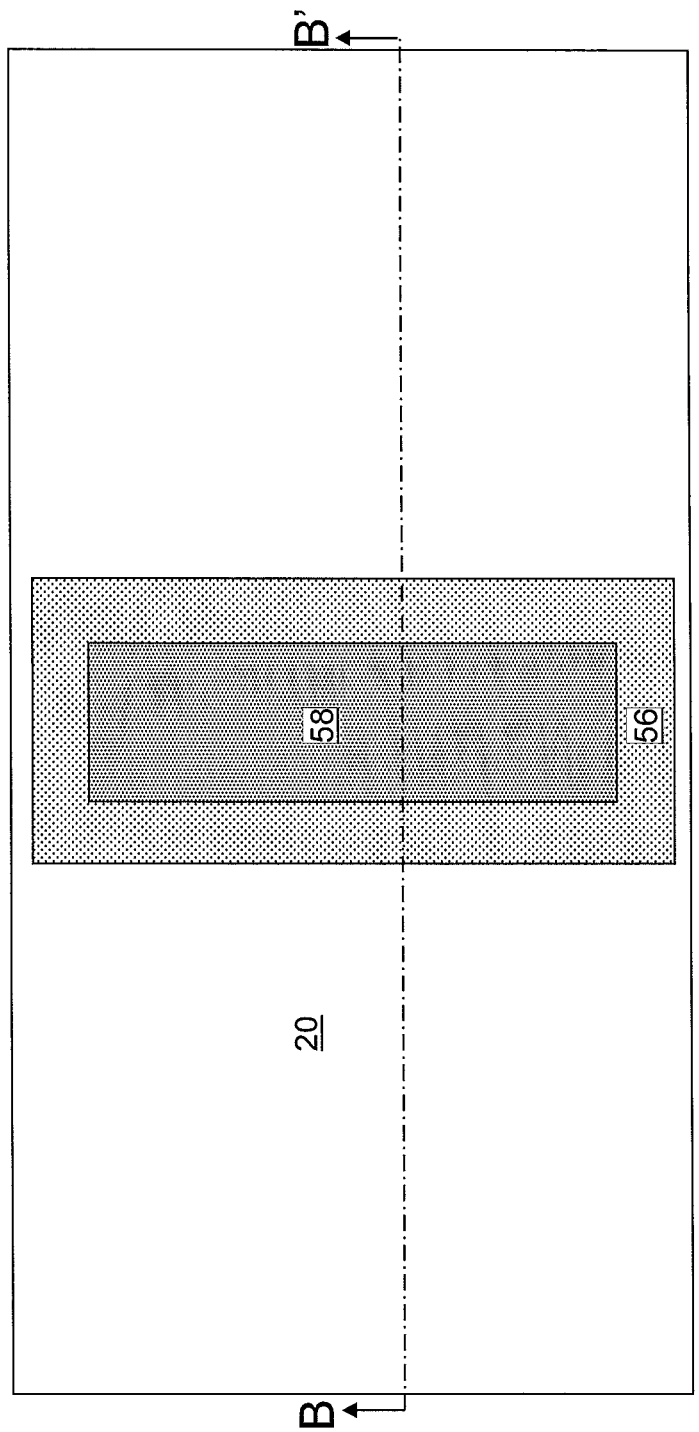

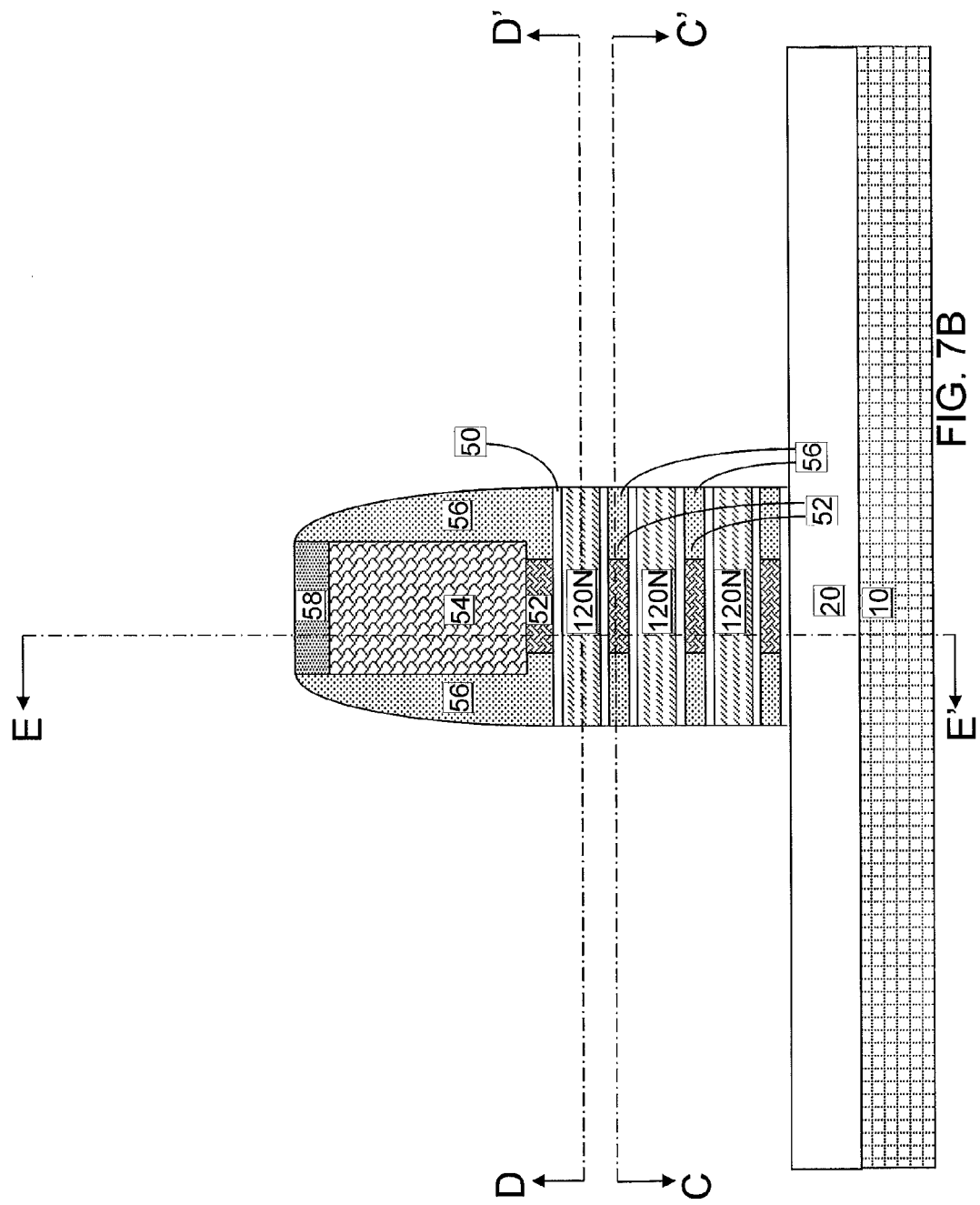

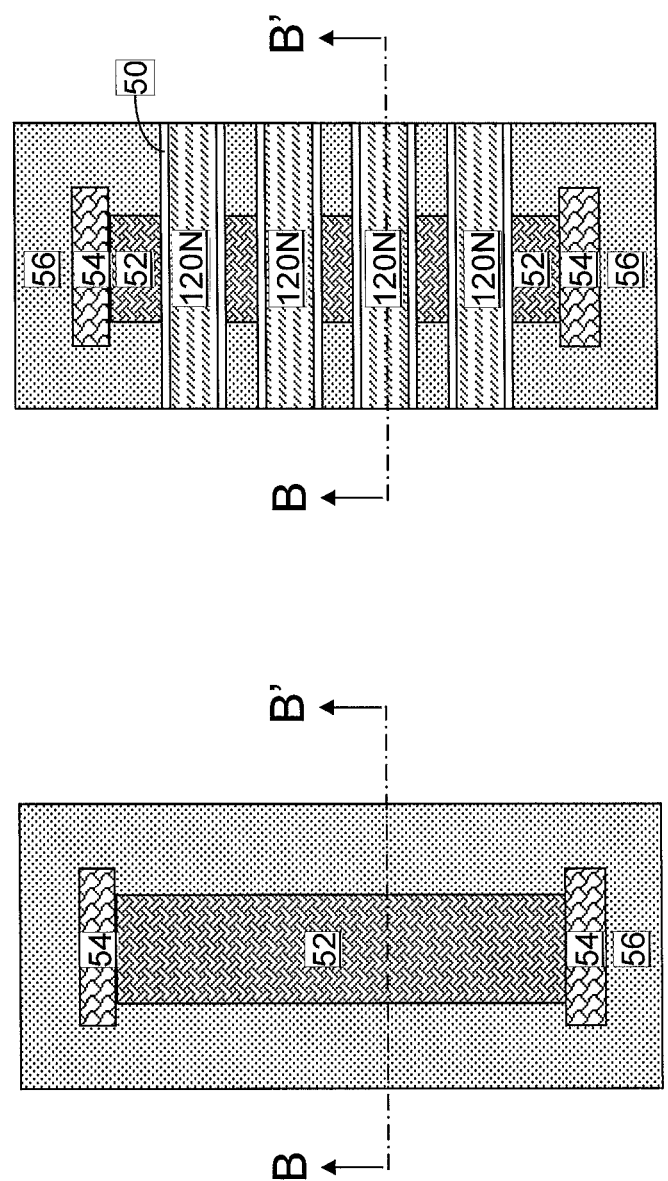

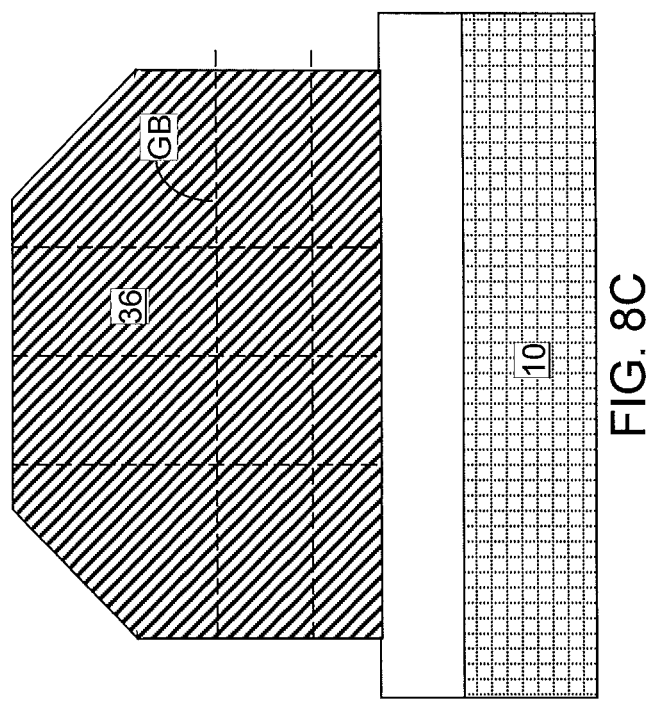

NON-REPLACEMENT GATE NANOMESH FIELD EFFECT TRANSISTOR WITH EPITIXIALLY GROWN SOURCE AND DRAIN

CROSS REFERENCE TO RELATED APPLICATION

This application is a continuation of U.S. patent application Ser. No. 13/796,418, filed Mar. 12, 2013 the entire content and disclosure of which is incorporated herein by reference.

BACKGROUND

The present disclosure relates to a semiconductor structure, and particularly to a wire-first, gate-first nanomesh field effect transistor with complete etch removal and epitaxial regrowth of source and drain regions, and a method of manufacturing the same.

While nanowire field effect transistors offer the potential for scaling semiconductor devices in future generations, one of the challenges for the nanowire field effect transistors is the amount of current per unit device area. Another of the challenges for the nanowire field effect transistors is the complexity of processing steps employed to form the nanowire field effect transistors. Particularly, processing steps to form a replacement gate structure over nanowires introduce many additional processing steps, thereby increasing the processing time and the manufacturing cost for nanowire field effect transistors.

SUMMARY

An alternating stack of two different semiconductor materials is patterned to include two pad regions connected by nanowire regions. A semiconductor material is laterally etched selective to another semiconductor material to form a nanomesh including suspended semiconductor nanowires. Gate dielectrics, a gate electrode, and a gate cap dielectric are formed over the nanomesh. A dielectric spacer is formed around the gate electrode. The semiconductor materials in the two pad regions and physically exposed portions of the nanomesh are removed employing the dielectric spacer and the gate cap dielectric as an etch mask. A source region and a drain region are epitaxially grown from end surfaces of the nanomesh.

According to an aspect of the present disclosure, a method of forming a semiconductor structure is provided. An alternating stack of a first semiconductor material and a second semiconductor material is formed on a substrate. The alternating stack is patterned to form a patterned stack including a nanowire-including region, a first pad region adjoining the nanowire-including region, and a second pad region adjoining the nanowire-including region and spaced from the first pad region. The second semiconductor material is removed selective to the first semiconductor material. The nanowire-including region includes semiconductor nanowires containing the first semiconductor material and suspended between the first pad region and the second pad region, and does not include the second semiconductor material. The first and second pad regions include second semiconductor material pad portions having sidewalls that are laterally recessed from sidewalls of first semiconductor material pad portions. A gate electrode structure straddling the semiconductor nanowires is formed. A gate spacer is formed around the gate electrode structure. Portions of the first and second semiconductor material are removed by an etch process employing a combination of the gate spacer and the gate electrode structure as an etch mask. A source region and a drain region are formed by growing a semiconductor material on physically exposed end surfaces of remaining portions of the semiconductor nanowire.

According to another aspect of the present disclosure, a semiconductor structure is provided. A plurality of semiconductor nanowires is spaced from a top surface of a substrate by different distances, and extends along a lengthwise direction. A plurality of gate dielectrics contacts all lengthwise surfaces of the plurality of semiconductor nanowires that extend along the lengthwise direction. A gate electrode contacts the plurality of gate dielectrics and laterally surrounds each semiconductor nanowire not in contact with the substrate among the plurality of semiconductor nanowires. A gate spacer is in physical contact with lengthwise surfaces of the gate electrode.

BRIEF DESCRIPTION OF SEVERAL VIEWS OF THE DRAWINGS

FIG. 3A is a top-down view of the exemplary semiconductor structure after lateral recessing of a second semiconductor material selective to a first semiconductor material and removal of the patterned dielectric mask structure and rounding of the semiconductor nanowires by an anneal at an elevated temperature according to an embodiment of the present disclosure.

FIG. 3B is a vertical cross-sectional view of the exemplary semiconductor structure along the vertical plane B-B' of FIG. 3A.

FIG. 3D is a vertical cross-sectional view of the exemplary semiconductor structure along the vertical plane D-D' of FIG. 3A.

FIG. 5A is a top-down view of the exemplary semiconductor structure after formation of a metallic material portion, a semiconductor gate electrode, and a gate cap dielectric according to an embodiment of the present disclosure.

FIG. 5D is a vertical cross-sectional view of the exemplary semiconductor structure along the vertical plane B-B' of FIG. 5A.

FIG. 5E is a vertical cross-sectional view of the exemplary semiconductor structure along the vertical plane B-B' of FIG. 5A.

FIG. 6B is a vertical cross-sectional view of the exemplary semiconductor structure along the vertical plane B-B' of FIG. 6A.

FIG. 6D is a vertical cross-sectional view of the exemplary structure along the vertical plane D-D' of FIG. 6A.

FIG. 6E is a vertical cross-sectional view of the exemplary semiconductor structure along the vertical plane E-E' of FIG. 6A.

FIG. 7A is a top-down view of the exemplary semiconductor structure formation of a gate spacer and removal of physically exposed portions of the patterned semiconductor material stack according to an embodiment of the present disclosure.

FIG. 7B is a vertical cross-sectional view of the exemplary semiconductor structure along the vertical plane B-B' of FIG. 7A.

FIG. 7C is a horizontal cross-sectional view of the exemplary semiconductor structure along the horizontal plane C-C' of FIG. 7B.

FIG. 7D is a horizontal cross-sectional view of the exemplary semiconductor structure along the horizontal plane D-D' of FIG. 7A.

FIG. 8C is a vertical cross-sectional view of the exemplary semiconductor structure along the vertical plane C-C' of FIG. 8A.

DETAILED DESCRIPTION

Figure 1:
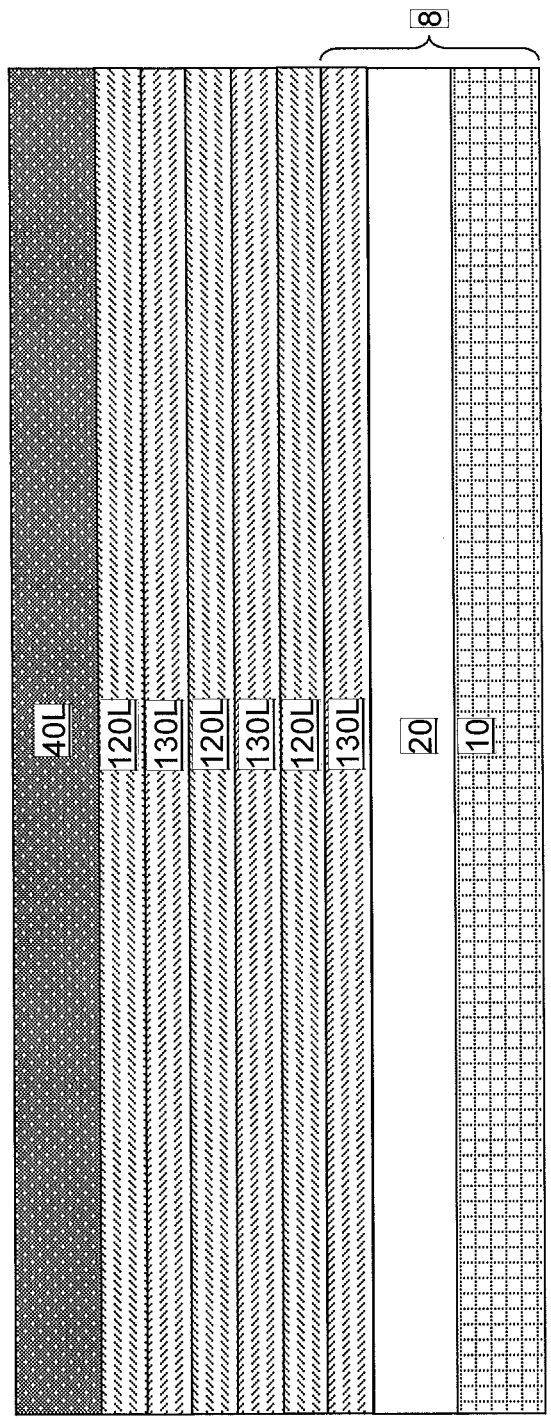
FIG. 1 is a vertical cross-sectional view of an exemplary semiconductor structure after formation of an alternating stack of a first semiconductor material and a second semiconductor material and a dielectric mask layer according to an embodiment of the present disclosure.

As stated above, the present disclosure relates to a nanomesh field effect transistor employing a wire-first, gate-first flow with complete etch removal and epitaxial regrowth of source and drain regions, and a method of manufacturing the same. Aspects of the present disclosure are now described in detail with accompanying figures. It is noted that like reference numerals refer to like elements across different embodiments. The drawings are not necessarily drawn to scale.

Referring to FIG. 1, an exemplary semiconductor structure according to an embodiment of the present disclosure can be formed by providing a semiconductor-on-insulator (SOI) substrate 8 including a handle substrate 10, an insulator layer 20, and a single crystalline semiconductor material layer on top of the insulator layer. The handle substrate 10 can include a semiconductor material, an insulator material, and/or a conductive material. The insulator layer 20 can include, for example, silicon oxide, silicon nitride, aluminum oxide, or any other dielectric material compatible with semiconductor processing technology. In one embodiment, the single crystalline semiconductor material layer can include a semiconductor material.

An alternating stack of the first semiconductor material and a second semiconductor material that is different from the first semiconductor material is formed. For example, the alternating stack can include first semiconductor material layers 120L and second semiconductor material layers 130L. Each of the first semiconductor material layers 120L includes a first semiconductor material, and each of the second semiconductor material layers 130L includes a second semiconductor material. Thus, an alternating stack of the first semiconductor material and the second semiconductor material is formed on a substrate (10, 20) that includes the handle substrate 10 and the buried insulator layer 20.

In one embodiment, the SOI substrate 8 as provided may include a second semiconductor material layer 130 including the second material. Alternatively, the SOI substrate 8 may be provided with a top semiconductor layer (not shown) provided directly on the top surface of the insulator layer 20, and an alternating stack having a second semiconductor material layer 130 as the bottommost layer may be formed on the top semiconductor layer. In one embodiment, the top semiconductor layer may be a single crystalline silicon layer having a thickness in a range from 10 nm to 100 nm.

In one embodiment, each first semiconductor material layer 120L can be a single crystalline semiconductor material layer. The second semiconductor material is different in composition from the first semiconductor material. Each second semiconductor material layer 130L is deposited as single crystalline semiconductor material layers in epitaxial alignment with the underlying first semiconductor material layer 120L. Thus, the entirety of the alternating stack (120L, 130L) is single crystalline, i.e., have an epitaxial alignment throughout the entirety thereof.

In one embodiment, each of the first semiconductor material and the second semiconductor material can be independently selected from elemental semiconductor materials, which include silicon, germanium, a silicon-germanium alloy, a silicon-carbon alloy, and a silicon-germanium-carbon alloy, provided that the composition of the first semiconductor material and the second semiconductor material are different, the first semiconductor material can be epitaxially deposited on the second semiconductor material and vice versa, and an etch chemistry that can remove the second semiconductor material selective to the first semiconductor material exists. As used herein, an etch chemistry that etches a first material is selective to the second material if the etch rate of the second material is less than ⅓ of the etch rate of the first material. For example, an etch chemistry that includes a mixture of hydrogen peroxide and hydrofluoric acid can etch a silicon-germanium alloy having an atomic germanium concentration greater than 50% selective to silicon or a silicon-germanium alloy having an atomic germanium concentration less than 20%.

Alternately, each of the first semiconductor material and the second semiconductor material can be independently selected from compound semiconductor materials, provided that the composition of the first semiconductor material and the second semiconductor material are different, the first semiconductor material can be epitaxially deposited on the second semiconductor material and vice versa, and an etch chemistry that can remove the second semiconductor material selective to the first semiconductor material exists. In one embodiment, each of the first semiconductor material and the second semiconductor material can be independently selected from a III-V compound semiconductor material, which can be one of InSb, InP, InN, InGaSb, InGaP, InGaN, InGaAsSb, InGaAsP, InGaAsN, InGaAs, InAsSbP, InAsSb, InAs, InAlAsN, GaSb, GaP, GaN, GaInNAsSb, GaInAsSbP, GaAsSbN, GaAsSb, GaAsP, GaAsN, GaAs, BP, BN, BN, BAs, AlSb, AlP, AN, AlInSb, AlInAsP, AlInAs, AlGaP, AlGaN, AlGaInP, AlGaAsP, AlGaAsN, AlGaAs, and AlAs.

Yet alternately, one of the first semiconductor material and the second semiconductor material can be a III-V compound semiconductor material, and the other of the first semiconductor material and the second semiconductor material can be an elemental semiconductor material or an alloy of at least two elemental semiconductor materials, provided that the composition of the first semiconductor material and the second semiconductor material are different, the first semiconductor material can be epitaxially deposited on the second semiconductor material and vice versa, and an etch chemistry that can remove the second semiconductor material selective to the first semiconductor material exists.

In a non-limiting illustrative example, the first semiconductor material can be single crystalline silicon, and the second semiconductor material can be a silicon-germanium alloy having an atomic concentration of germanium in a range from 10% to 50%.

The thicknesses of the first semiconductor material layers 120L and the second semiconductor material layers 130L are selected such that the entirety of the epitaxial alignment of the first semiconductor material layers 120L and the second semiconductor material layers 130L can be maintained throughout the entirety of the alternating stack (120L, 130L). Thus, the thickness of each of the first semiconductor material layers 120L and the second semiconductor material layers 130L is less than the critical thickness, which is the thickness at which an epitaxial material begins to lose epitaxial registry with the underlying single crystalline layer by developing dislocations.

In one embodiment, the first and second semiconductor materials can be selected such that the thicknesses of each first semiconductor material layer 120L and each second semiconductor material layer 130L can be in a range from 3 nm to 60 nm, although lesser and greater thicknesses can also be employed. In one embodiment, the thickness of the first semiconductor material layers 120L can be the same across all of the first semiconductor material layer 120L. In this case, the thicknesses of each first semiconductor material layer 120L is herein referred to as a first thickness. Additionally or alternatively, the thicknesses of the second semiconductor material layers 130L can be the same across all of the second semiconductor material layers 130L. In this case, the thickness of each second semiconductor material layer 130L is herein referred to as a second thickness.

At least two of semiconductor material layers 120L are provided within the alternating stack (120L, 130L). The upper end of the alternating stack (120L, 130L) may terminate with a first semiconductor material layer 120L or with a second semiconductor material layer 130L. Further, while the present disclosure is described employing a structure in which a first semiconductor material layer 120L is in direct contact with the insulator layer 20, embodiments are expressly contemplated herein in which a second semiconductor material layer 130L is a bottommost layer of the alternating stack (120L, 130L), and is in physical contact with the insulator layer 20. In this case, the SOI substrate 8 as provided may include a stack, from bottom to top, of the handle substrate 10, the insulator layer 20, and a second semiconductor material layer 130L including a single crystalline second semiconductor material.

The number of repletion for a pair of a first semiconductor material layer 120L and a second semiconductor material layer 130L can be 1 or greater. In one embodiment, the number of repletion for a pair of a first semiconductor material layer 120L and a second semiconductor material layer 130L can be in a range from, and including, 2 to, and including, 30. The alternating stack may terminate with a second semiconductor material layer 130L or with a first semiconductor material layer 120L.

A dielectric mask layer 40L can be deposited above the alternating stack (120L, 130L), for example, by chemical vapor deposition (CVD). The dielectric mask layer 40L can include a dielectric material such as silicon nitride, silicon oxide, silicon oxynitride, a dielectric metal oxide, a dielectric metal nitride, or a dielectric metal oxynitride. The thickness of the dielectric mask layer 40L can be from 5 nm to 100 nm, although lesser and greater thicknesses can also be employed.

Figure 2A:
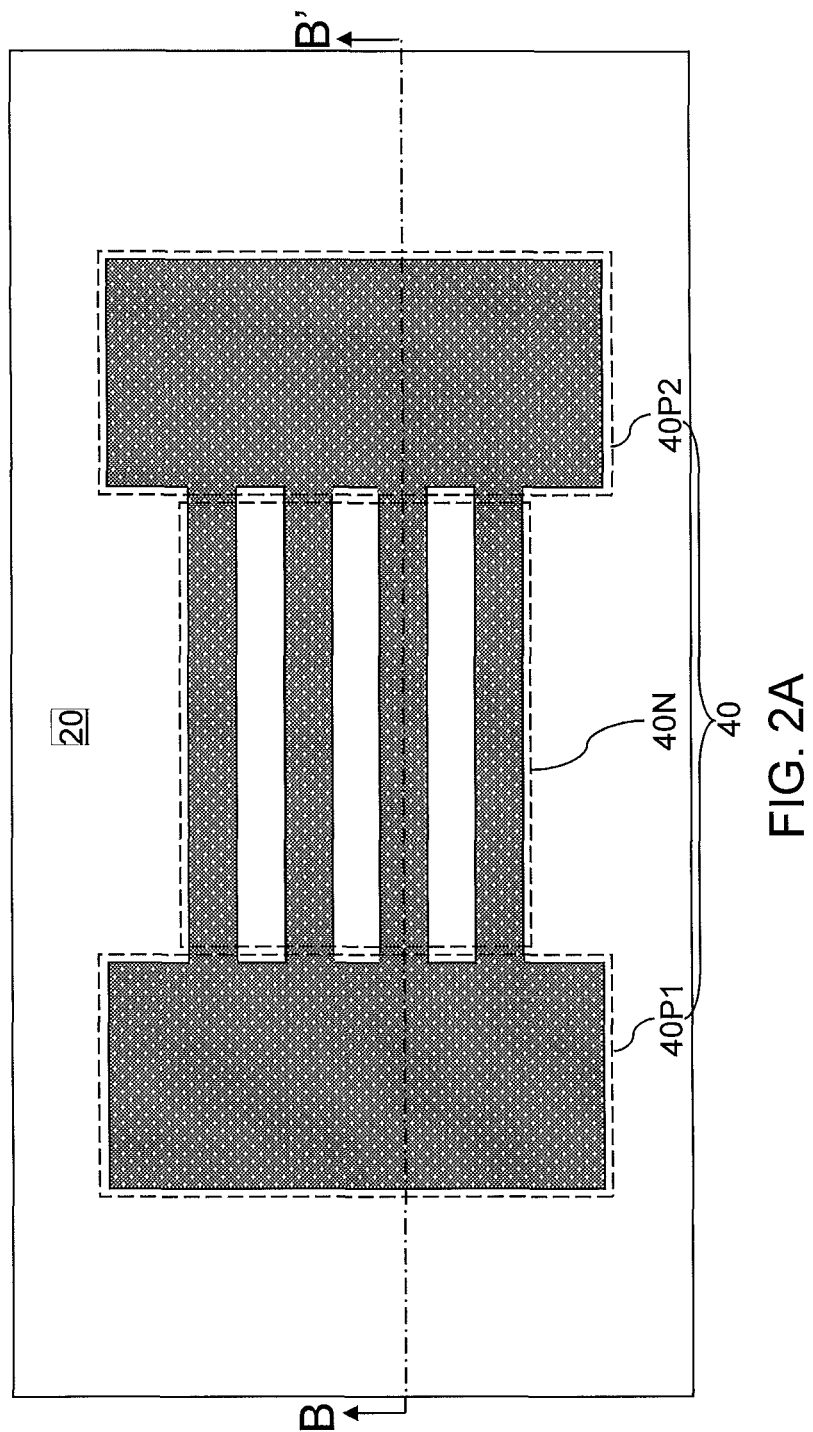
FIG. 2A is a top-down view of the exemplary semiconductor structure after formation of a patterned dielectric mask structure and a patterned semiconductor layer stack according to an embodiment of the present disclosure.
Figure 2B:
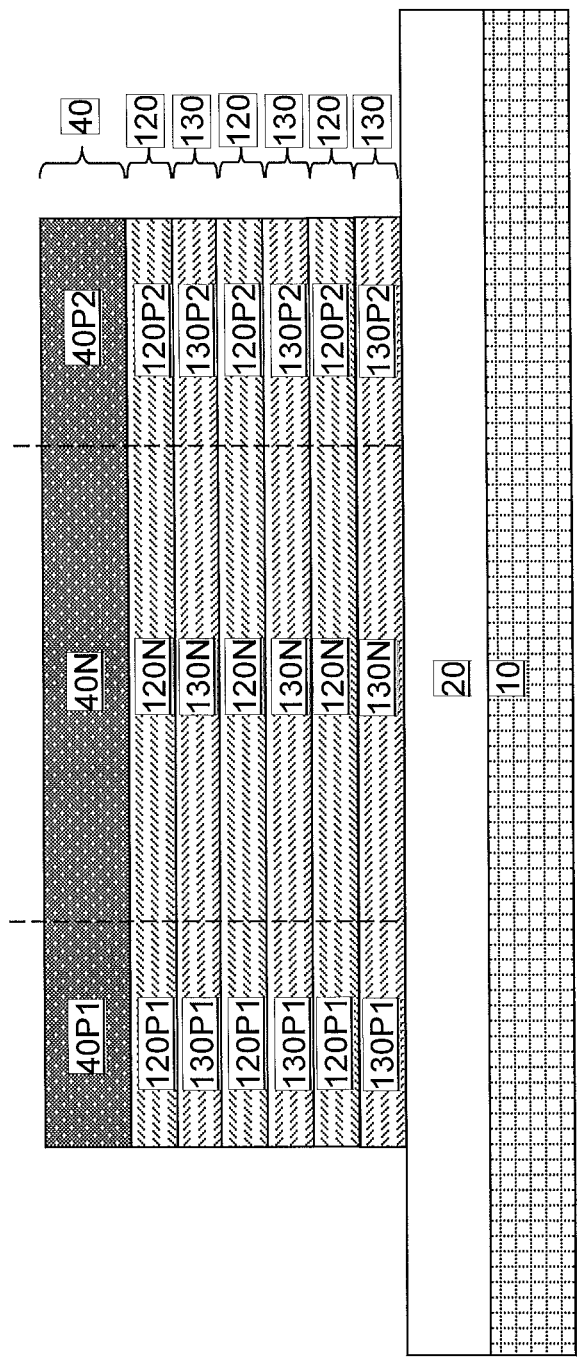
FIG. 2B is a vertical cross-sectional view of the exemplary semiconductor structure along the vertical plane B-B' of FIG. 2A.
Figure 3C:
FIG. 3C is a horizontal cross-sectional view of the exemplary semiconductor structure along the horizontal plane C-C' of FIG. 3B.

Referring to FIGS. 2A and 2B, the dielectric mask layer 40L can be subsequently patterned to form a patterned dielectric mask structure 40. The patterning of the dielectric mask layer 40L into the patterned dielectric mask structure 40 can be performed, for example, by applying a photoresist layer (not shown) above the dielectric mask layer 40L, lithographically patterning the photoresist layer by lithographic exposure and development, and by transferring the pattern in the patterned photoresist layer into the dielectric mask layer 40L by an anisotropic etch that employs the patterned photoresist layer as an etch mask. The patterned photoresist layer can be subsequently removed, for example, by ashing.

The pattern in the patterned dielectric mask structure 40 is subsequently transferred through the alternating stack (120L, 130L) by an anisotropic etch that employs the patterned dielectric mask structure 40 as an etch mask. The alternating stack (120L, 130L) is thus patterned to form a patterned stack (120, 130) including patterned first semiconductor material layers 120 and at least one patterned second semiconductor material layer 130.

As seen in a top-down view, the combination of the patterned dielectric mask structure 40 and the patterned stack (120, 130) includes a nanowire-including region, a first pad region adjoining the nanowire-including region, and a second pad region adjoining the nanowire-including region and spaced from the first pad region. The portion of the patterned dielectric mask structure 40 within the nanowire-including region is herein referred to as a plurality of fin-defining dielectric structures 40N. The portion of the patterned dielectric mask structure 40 within the first pad region is herein referred to as a first dielectric pad region 40P1. The portion of the patterned dielectric mask structure 40 within the second pad region is herein referred to as a second dielectric pad region 40P2.

Referring to FIGS. 3A-3D, the second semiconductor material is removed selective to the first semiconductor material by an isotropic etch process, which can be a wet etch process or a dry etch proves. For example, if the first semiconductor material is single crystalline silicon and the second semiconductor material is a silicon-germanium alloy having an atomic concentration of germanium greater than 30%, the second semiconductor material can be removed selective to the first semiconductor material by a wet etch employing a combination of hydrogen peroxide and hydrofluoric acid.

The isotropic etch process continues until the second semiconductor material is completely removed from the nanowire-including region, i.e., from underneath the plurality of fin-defining dielectric structures 40N. The second semiconductor material is laterally recessed in each of the first pad region and the second pad region. The remaining portions of the second semiconductor material in the first and second pad regions are herein referred to as second semiconductor material pad portions. The second semiconductor material pad portions within the first pad region are herein referred to as first-pad-region second semiconductor material pad portions 130P1, and the second semiconductor material pad portions within the second pad region are herein referred to as second-pad-region second semiconductor material pad portions 130P2.

The portions of the first semiconductor material in the first and second pad regions are herein referred to as first semiconductor material pad portions. The first semiconductor material pad portions within the first pad region are herein referred to as first-pad-region first semiconductor material pad portions 120P1, and the first semiconductor material pad portions within the second pad region are herein referred to as second-pad-region first semiconductor material pad portions 130P2. The sidewalls of the second semiconductor material pad portions (130P1, 130P2) are laterally recess from the sidewalls of the overlying or underlying first semiconductor material pad portions (120P1, 120P2) by a same lateral offset distance.

The nanowire-including region includes semiconductor nanowires 120N containing the first semiconductor material. The semiconductor nanowires 120N are suspended between the first pad region and the second pad region. The nanowire-including region does not include the second semiconductor material. The first and second pad regions include second semiconductor material pad portions (130P1, 130P2) having sidewalls that are laterally recessed from sidewalls of first semiconductor material pad portions (120P1, 120P2).

The patterned dielectric mask structure 40 can be removed selective to the first semiconductor material after, or before, the isotropic etch process that removes the second semiconductor material. For example, if the patterned dielectric mask structure 40 includes silicon oxide or silicon nitride, a wet etch employing hydrofluoric acid or hot phosphoric acid may be employed to remove the patterned dielectric mask structure 40.

Each of the semiconductor nanowires 120N can have a rectangular vertical cross-sectional area along the direction perpendicular to the lengthwise direction of the semiconductor nanowires 120N. As used herein, a "lengthwise direction" of a structure refers to the direction along which the moment of inertia of the structure is minimized. The exemplary semiconductor structure can be annealed at an elevated temperature to reflow the first semiconductor material of the semiconductor nanowires 120N. For example, the exemplary semiconductor structure can be annealed at a temperature in a range from 900° C. to 1,200° C. in a hydrogen-containing environment in which the partial pressure of hydrogen in a range from 1 mTorr to 760 Torr. The duration of the anneal can be determined based on the degree of roundness of the vertical cross-sectional profile of the annealed semiconductor nanowires.

In one embodiment, the semiconductor nanowires 120N can have a cylindrical shape with a cross-sectional shape bounded by convex surfaces that extend along the lengthwise direction of the semiconductor nanowires 120N and invariant under translation along the lengthwise direction of the semiconductor nanowires 120N. In one embodiment, a vertical cross-sectional shape of each semiconductor nanowire 120N can consist of convex surfaces that extend along the lengthwise direction of the second nanowire 120N.

In one embodiment, vertical cross-sectional shapes of the annealed semiconductor nanowires 120N may be substantially circular. As used herein, a shape is substantially circular if the deviation of a shape from a circle is not greater than twice the surface roughness of the shape.

In one embodiment, vertical cross-sectional shapes of the annealed semiconductor nanowires 120N may be substantially elliptical. As used herein, a shape is substantially circular if the deviation of a shape from an ellipse having an ellipticity greater than 0 (i.e., not a circle) is not greater than twice the surface roughness of the shape. The surfaces of the semiconductor nanowires 120N that extend along the lengthwise direction of the semiconductor nanowires are convex. In one embodiment, the vertical cross-sectional shape of each semiconductor nanowire 120N can be invariant under translation along the semiconductor nanowires 120N, i.e., each semiconductor nanowire 120N can have a uniform vertical cross-sectional shape within vertical planes that are perpendicular to the lengthwise direction of the semiconductor nanowires 120N that does not change with the location of the vertical cross-section. The diameter or the major axis of each semiconductor nanowire 120N, if the corresponding semiconductor nanowire is substantially circular or substantially elliptical and approximated by a circle or an ellipse, can be in a range from 5 nm to 100 nm, although lesser and greater dimensions can also be employed.

Figure 4A:
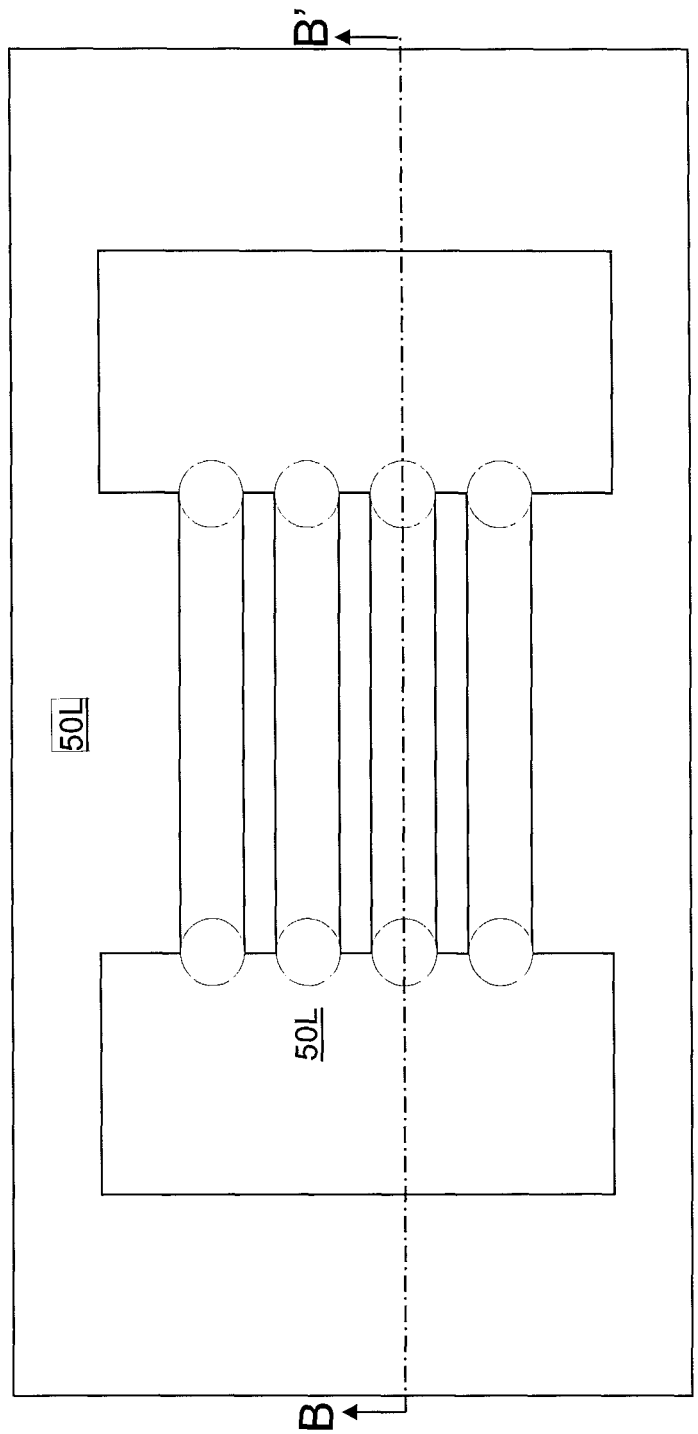
FIG. 4A is a top-down view of the exemplary semiconductor structure after formation of a gate dielectric layer according to an embodiment of the present disclosure.
Figure 4B:
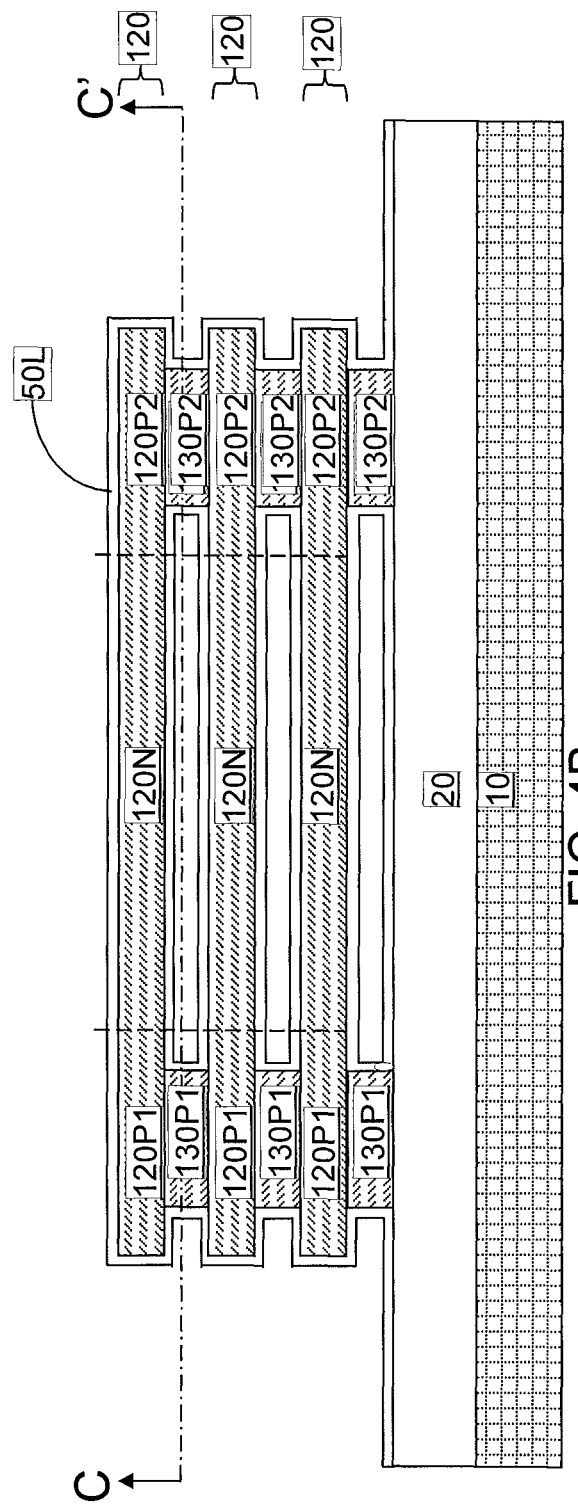
FIG. 4B is a vertical cross-sectional view of the exemplary semiconductor structure along the vertical plane B-B' of FIG. 4A.
Figure 5B:
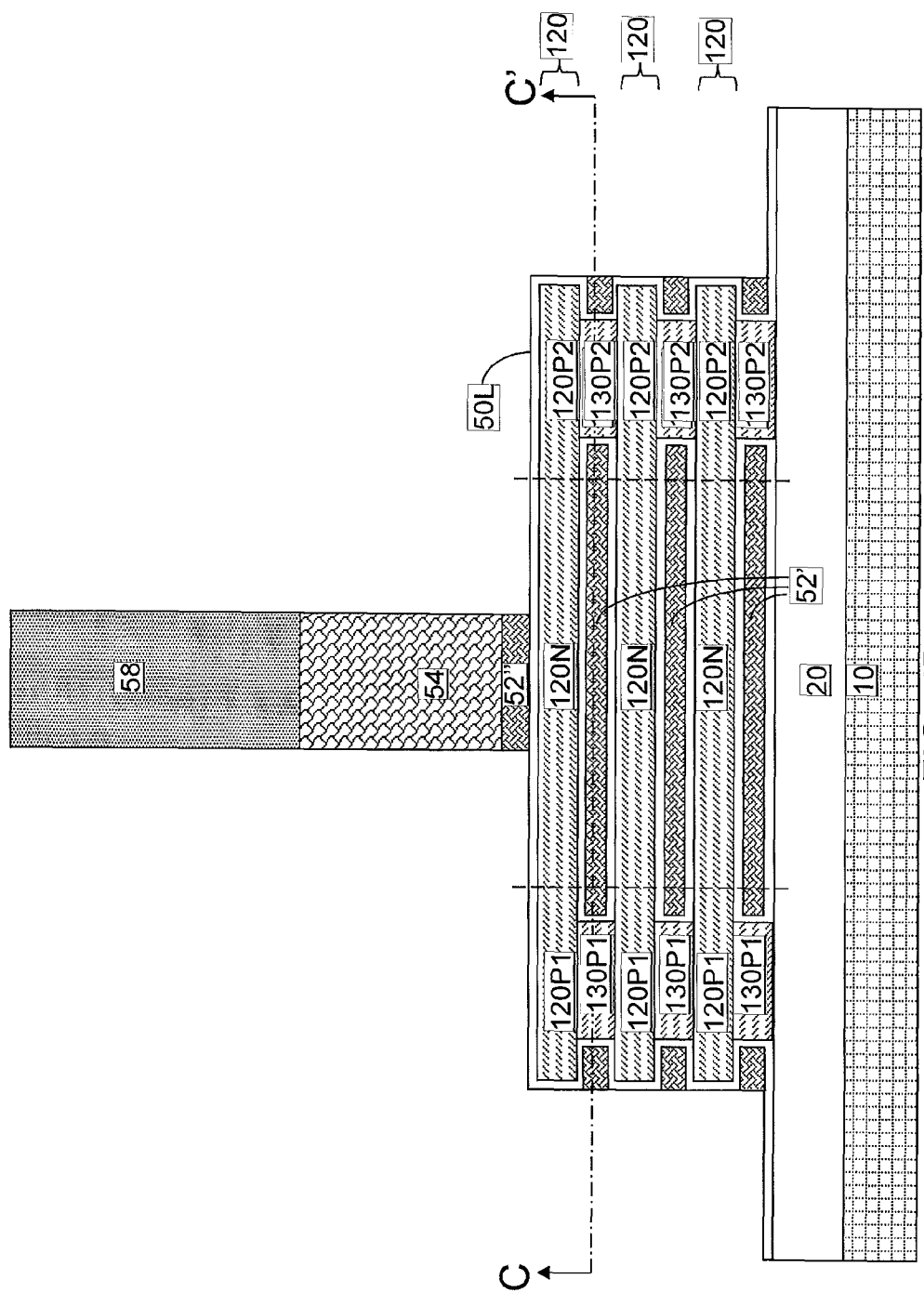
FIG. 5B is a vertical cross-sectional view of the exemplary semiconductor structure along the vertical plane B-B' of FIG. 5A.
Figure 5C:
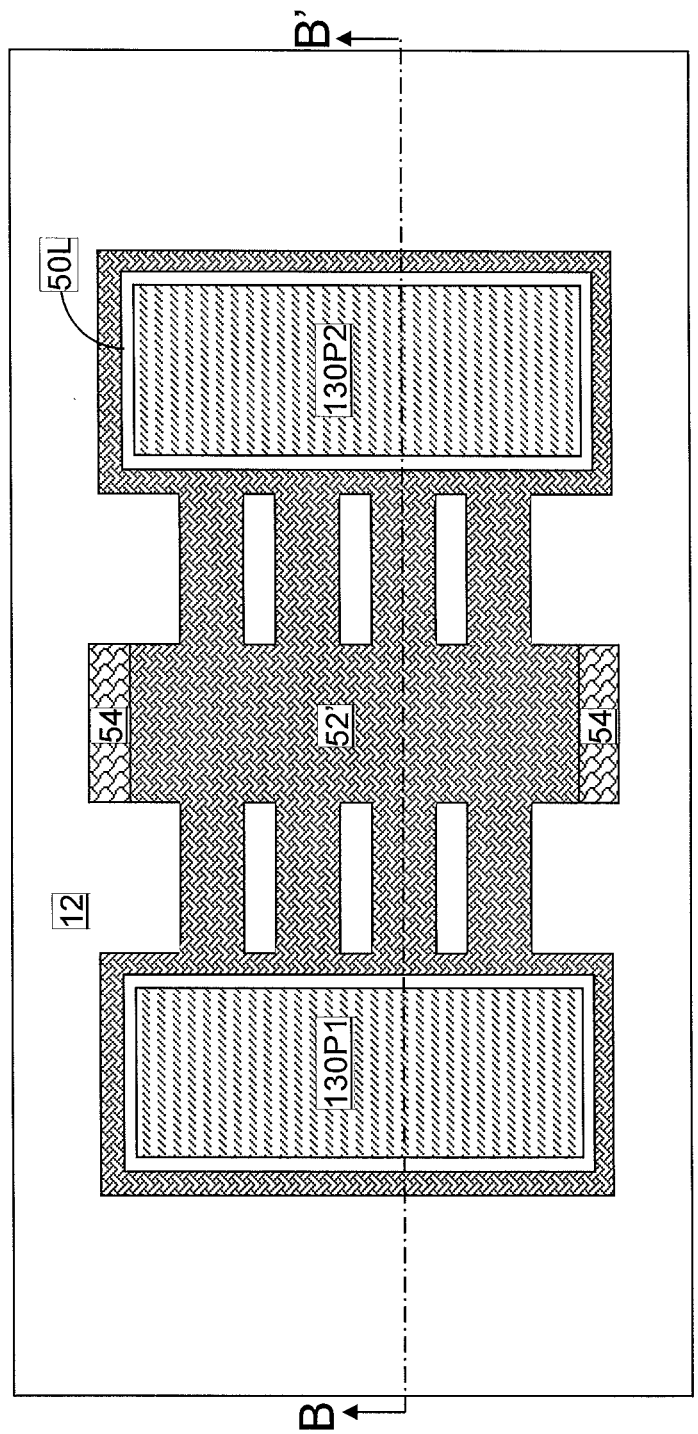
FIG. 5C is a horizontal cross-sectional view of the exemplary semiconductor structure along the vertical plane C-C' of FIG. 5B.
Figure 6A:
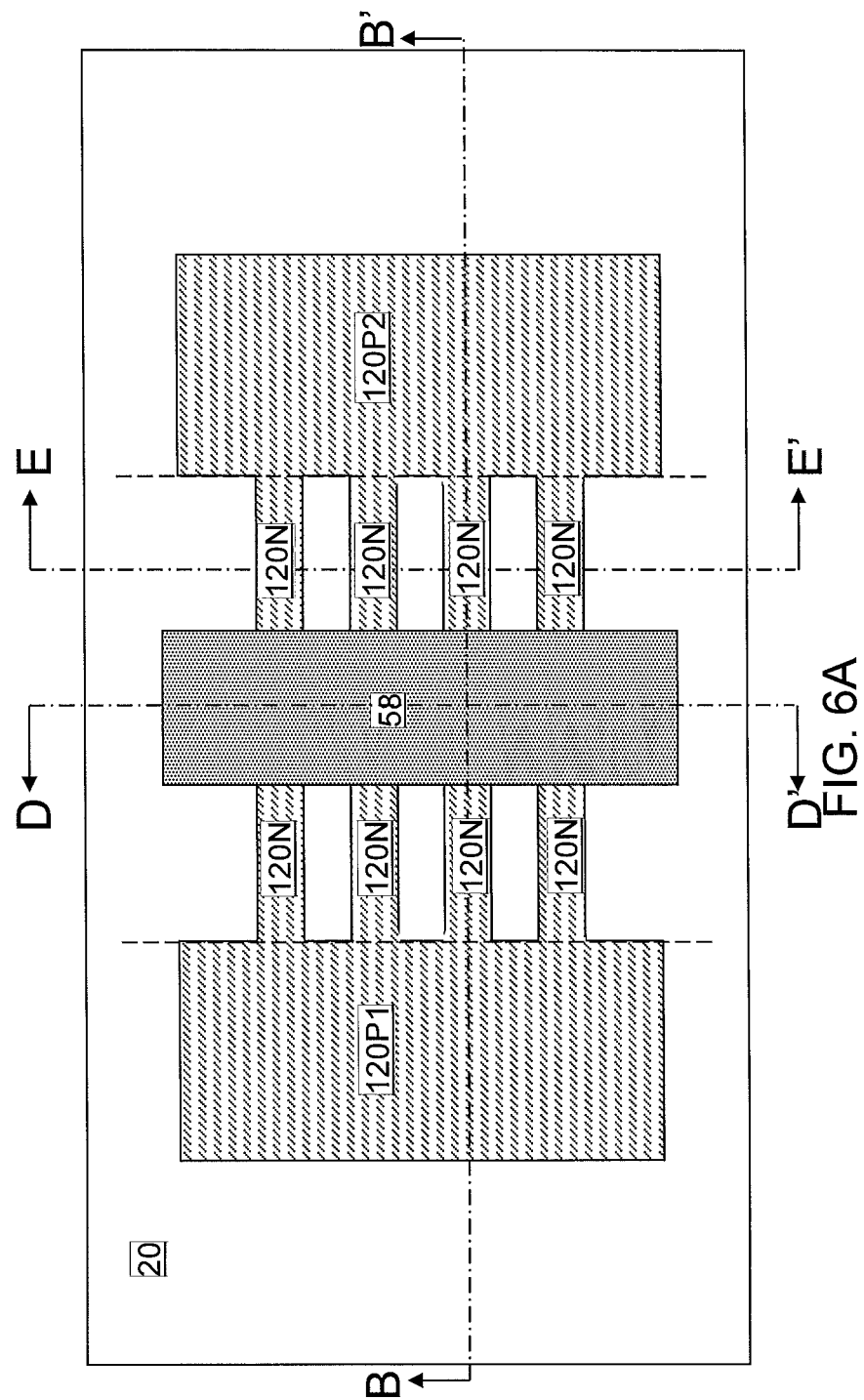
FIG. 6A is a top-down view of the exemplary semiconductor structure after a recess etch of the metallic material portion to form a metallic gate electrode according to an embodiment of the present disclosure.
Figure 6C:
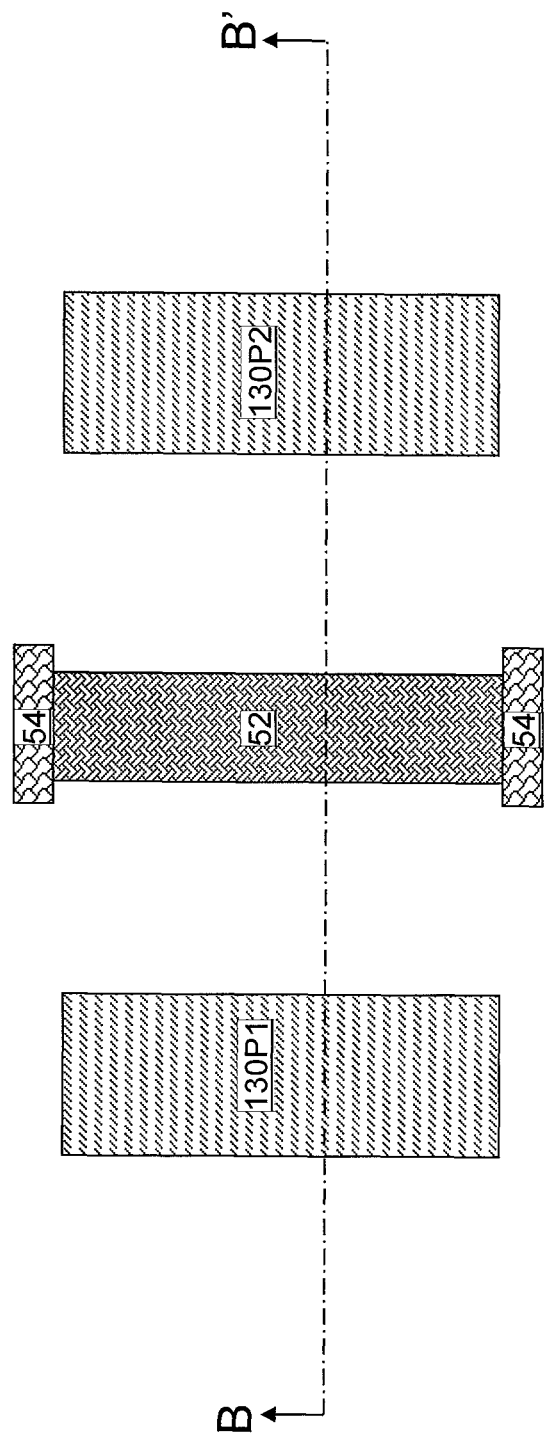
FIG. 6C is a horizontal cross-sectional view of the exemplary semiconductor structure along the vertical plane C-C' of FIG. 6B.

Referring to FIGS. 4A and 4B, a gate dielectric layer 50L is formed on the patterned stack (120, 130) including patterned first semiconductor material layers 120 and at least one patterned second semiconductor material layer 130. The gate dielectric layer 50L can be formed, for example, by atomic layer deposition (ALD), chemical vapor deposition (CVD), conversion of the physically exposed surfaces of the patterned first semiconductor material layers 120 and at least one patterned second semiconductor material layer 130 into a semiconductor-element-containing dielectric material (such as silicon oxide, silicon nitride, germanium oxide, etc.), or combinations thereof. In one embodiment, the gate dielectric layer 50L can include at least one deposited dielectric material. In this case, the gate dielectric layer 50L can include a dielectric metal oxide having a dielectric constant greater than 8.0 and commonly known in the art as a "high-k dielectric material." Alternately or additionally, the gate dielectric layer 50L can include a semiconductor-element-containing dielectric material. The gate dielectric layer 50L is formed on the semiconductor nanowires 120 and the first and second pad regions (120P1, 120P2, 130P1, 130P2). The thickness of the gate dielectric layer 50L can be in a range from 1 nm to 6 nm, although lesser and greater thicknesses can also be employed.

Referring to FIGS. 5A-5E, at least one gate electrode material layer and a gate cap dielectric layer are deposited over the patterned stack (120, 130), and is patterned to form at least one conductive material portion and a gate cap dielectric 58. In one embodiment, the at least one conductive material layer can include a stack of a metallic gate electrode material layer and a semiconductor gate electrode material layer. The metallic gate electrode material layer can include a metallic work function material for adjusting the threshold voltage of a field effect transistor to be formed. The metallic work function material can be an elemental metal, an intermetallic alloy, and/or a conductive metal compound. The metallic gate electrode material layer can be formed, for example, by chemical vapor deposition (CVD) or atomic layer deposition (ALD). The thickness of the metallic gate electrode material layer, as measured in a planar region, can be from 5 nm to 100 nm, although lesser and greater thicknesses can also be employed. The semiconductor gate electrode material layer can include a doped semiconductor material such as doped polysilicon, a doped silicon-germanium alloy, or a doped compound semiconductor material. The semiconductor gate electrode material layer can be formed, for example, by chemical vapor deposition. The thickness of the semiconductor gate electrode material layer, as measured in a planar region, can be from 5 nm to 500 nm, although lesser and greater thicknesses can also be employed. The gate cap dielectric layer includes a dielectric material layer such as silicon oxide, silicon nitride, silicon oxynitride, or a combination thereof. The thickness of the gate cap dielectric layer, as measured in a planar region, can be from 50 nm to 300 nm, although lesser and greater thicknesses can also be employed.

In one embodiment, the metallic gate electrode material layer can fill the gaps between each vertically neighboring pair of semiconductor nanowires 120N. Further, the metallic gate electrode material layer can fill the recessed region between the sidewalls of the second semiconductor material pad portions (130P1, 130P2) and vertical planes including sidewalls of the first semiconductor material pad portions (120P1, 120P2).

The material layer stack including the metallic gate electrode material layer, the semiconductor gate electrode material layer, and the gate cap dielectric layer can be patterned, for example, by applying a photoresist layer (not shown) above the top surface of the gate cap dielectric layer, patterning the photoresist layer, and transferring the pattern in the photoresist layer through the gate cap dielectric layer, the semiconductor gate electrode material layer, and the metallic gate electrode material layer. At least one anisotropic etch can be employed to transfer the pattern in the photoresist layer into the stack of the gate cap dielectric layer, the semiconductor gate electrode material layer, and the metallic gate electrode material layer. In one embodiment, the gate dielectric layer 50L may be employed as an etch stop layer for the last processing step of the at least one anisotropic etch. The photoresist layer can be subsequently removed, for example, by ashing.

A remaining portion of the gate cap dielectric layer constitutes the gate cap dielectric 58. A remaining portion of the semiconductor gate electrode material layer constitutes a semiconductor gate electrode 54, and a remaining portion of the metallic gate electrode material layer constitutes a metallic material portion 52'. A portion of the semiconductor gate electrode 54, known as gate stringers, may be present outside of the area defined by photolithography due to the topography in the structure. The metallic material portion 52' is formed as a unitary structure, i.e., a single contiguous structure. A portion of the metallic material portion 52' is present between each vertically adjacent pair of the semiconductor nanowires 120N after the at least one anisotropic etch. The metallic material portion 52' laterally surrounds each of the second semiconductor material pad portions (130P1, 130P2) after the at least one anisotropic etch. The semiconductor gate electrode 54 is a contiguous remaining portion of the semiconductor gate electrode material layer, and overlies a portion of each of the semiconductor nanowire 120N after the at least one anisotropic etch.

Referring to FIGS. 6A-6E, one or more recess etches are performed to laterally recess the metallic material portion 52' and any gate stringers. Specifically, gate stringers are removed with an isotropic dry etch process or an isotropic wet etch process, and the metallic material portion 52', which is a remaining portion of the metallic gate electrode material layer after the at least one anisotropic etch, is isotropically etched employing an isotropic dry etch process or an isotropic wet etch process. The material of the metallic material portion 52' is removed from regions between each vertically neighboring pair of semiconductor nanowires 120N, and from around each second semiconductor material pad portions (130P1, 130P2). Thus, the metallic gate electrode material layer and gate stringers are completely removed from regions that do not underlie the regions originally defined by photolithography. The remaining portion of the metallic material portion 52' constitutes a metallic gate electrode 52. The metallic gate electrode 52 is formed underneath the semiconductor gate electrode 54.

The metallic gate electrode 52 and the semiconductor gate electrode 54 collectively constitute a gate electrode (52, 54). The gate electrode (52, 54) laterally surrounds at least one of the semiconductor nanowires 120N. Specifically, the gate electrode (52, 54) laterally surrounds all of the semiconductor nanowires 120N that are not in physical contact with the substrate (10, 20). The sidewalls of the metallic gate electrode 52 and the semiconductor gate electrode 54 may be are laterally offset from each other and from the sidewalls of the gate cap dielectric 58 after isotropically etching of the metallic material portion 52'.

The gate electrode (52, 54) and the gate cap dielectric 58 are collectively referred to as a gate electrode structure (52, 54, 58). The gate electrode structure (53, 54, 58) straddles each of the semiconductor nanowires 120N.

Figure 7E:
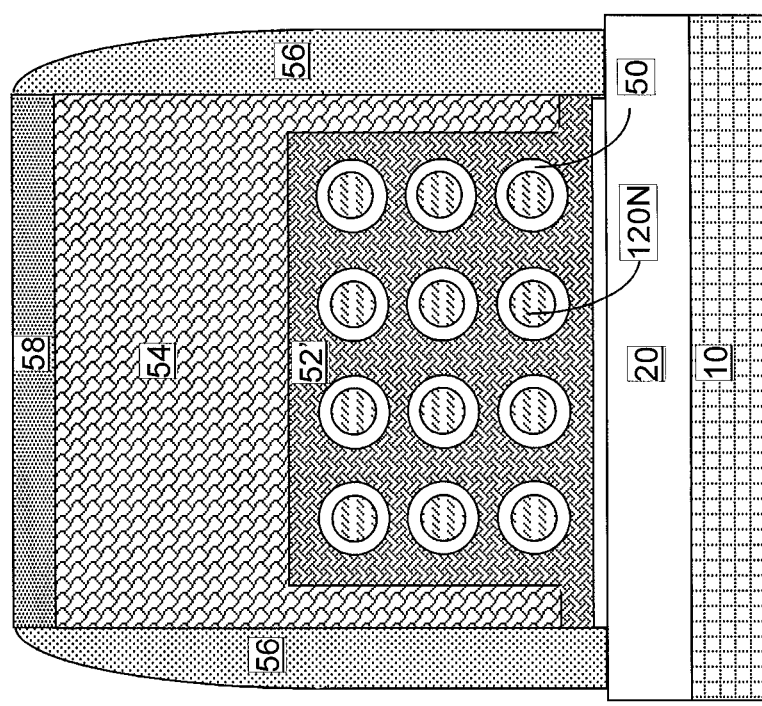
FIG. 7E is a vertical cross-sectional view of the exemplary semiconductor structure along the vertical plane E-E' of FIG. 7A.

In one embodiment, physically exposed portions of the gate dielectric layer 52L may be removed by an isotropic etch without etching the first and second semiconductor materials. The remaining portions of the gate dielectric layer 52L constitute gate dielectrics 52 (See FIGS. 7B, 5D, and 7E), which laterally surround portions of each semiconductor nanowire 120N. The isotropic etch can be, for example, a wet etch.

A vertical stack of at least two first patterned semiconductor layers 120 and at least one second patterned semiconductor material layer (130P1, 130P2) is thus provided. The vertical stack includes at least two first semiconductor material layer 120 and at least one second patterned semiconductor layer (130P1, 130P2) including the second semiconductor material. Each of the at least two first patterned semiconductor layers 120 includes at least one semiconductor nanowire 120N and a pair of first semiconductor material pad portions (120P1, 120P2) adjoining the at least one semiconductor nanowire 120N. Each of the at least one second patterned semiconductor layer (130P1, 130P2) includes a pair of second semiconductor material pad portions (130P1, 130P2) that are laterally spaced from each other and vertically contact at least one pair of first semiconductor material pad portions (120P1, 120P2).

The gate electrode structure (52, 54, 58) straddles the plurality of semiconductor nanowires 120N. The metallic gate electrode 52 is contact with the gate dielectrics 52, and the semiconductor gate electrode 54 is not in contact with the gate dielectrics 52. The gate electrode (52, 54) can laterally surround all of the plurality of semiconductor nanowires 120N that are not in physical contact with the substrate (10, 20).

Referring to FIGS. 7A-7E, a gate spacer 56 is formed around the gate electrode structure (52, 54, 58). The gate spacer 56 is formed, for example, by depositing a conformal dielectric material layer and anisotropically etching the conformal dielectric material layer employing a first anisotropic etch process. The gate spacer 56 includes a dielectric material such as silicon oxide, silicon nitride, silicon oxynitride, or a combination thereof. The first anisotropic etch process removes horizontal portions of the conformal dielectric material layer. In one embodiment, the first anisotropic etch process can collaterally etch the gate cap dielectric 58 so that the thickness of the gate cap dielectric 58 decreases during the first anisotropic etch process. The remaining vertical portions of the conformal dielectric material layer constitute the gate spacer 56, which laterally surrounds the gate electrode structure (52, 54, 58). The entirety of the gate spacer 56 is a single contiguous structure. In other words, each portions of the gate spacer 56 is contiguously connected to any other portion of the gate spacer 56.

In one embodiment, if the physically exposed portions of the gate dielectric layer 52L are not removed prior to formation of the gate spacer, the portions of the gate dielectric layer 52L that are not covered by the gate electrode structure (52, 54, 58) or the gate spacer 56 are removed, for example, by an isotropic etch.

In one embodiment, the anisotropic etch process used for the gate spacer material is not selective to the first and second semiconductor material, and these materials are removed from the source/drain regions at the same time as the spacer. This allows the formation of a thin spacer on the gate sidewall, with no spacer material remaining underneath suspended nanowires in the source/drain regions. During the spacer etch, physically exposed portions of the patterned stack (120, 130) that do not underlie the gate electrode structure (52, 54, 58) or the gate spacer 56 are removed. The entirety of the first semiconductor material pad portions (120P1, 120P2), the entirety of the second semiconductor material pad portions (130P1, 130P2), and end portions of the semiconductor nanowires 120N that do not underlie the gate cap dielectric 58 or the gate spacer 56 are removed during the second anisotropic etch process. After the second anisotropic etch process, end surfaces of the remaining portions of the semiconductor nanowires 120N are vertically coincident with vertical portions of outer sidewalls of the gate spacer 56 that adjoins the end surfaces of the remaining semiconductor nanowires 120N. The end surfaces of the semiconductor nanowires 120N can be perpendicular to the lengthwise direction of the semiconductor nanowires.

The exemplary semiconductor structure includes a plurality of semiconductor nanowires 120N that are spaced from the top surface of a substrate (10, 20) by different distances and extending along a lengthwise direction. A plurality of gate dielectrics 50 contacts each lengthwise surface of the plurality of semiconductor nanowires 120N that extend along the lengthwise direction. As used herein, a "lengthwise surface" of a structure refers to a surface that extend along the lengthwise direction of the structure. The gate electrode (52, 54) contacts the plurality of gate dielectrics 50 and laterally surrounds each semiconductor nanowire 120N that are not in contact with the substrate (10, 20) among the plurality of semiconductor nanowires 120N. The gate spacer 56 is in physical contact with all sidewall surfaces of the gate electrode (52, 54).

In one embodiment, the gate electrode (52, 54) can include a stack of the metallic gate electrode 52 and the semiconductor gate electrode 54. The metallic gate electrode 52 has a lesser width than the semiconductor gate electrode 54. The metallic gate electrode 52 is in contact with the plurality of gate dielectrics 50, and the semiconductor gate electrode 54 is not in contact with any gate dielectric 50.

A surface of the gate spacer 56 can be in physical contact with a bottom surface of the semiconductor gate electrode. End surfaces of the plurality of semiconductor nanowires 120N can be vertically coincident with vertical portions of outer sidewalls of the gate spacer 56. Further, end surfaces of the plurality of gate dielectrics 50 can be vertically coincident with the end surfaces of the plurality of semiconductor nanowires 120N. The gate electrode (52, 54) laterally surrounds all of the plurality of semiconductor nanowires 120N that are not in physical contact with the substrate (10, 20).

Figure 8A:
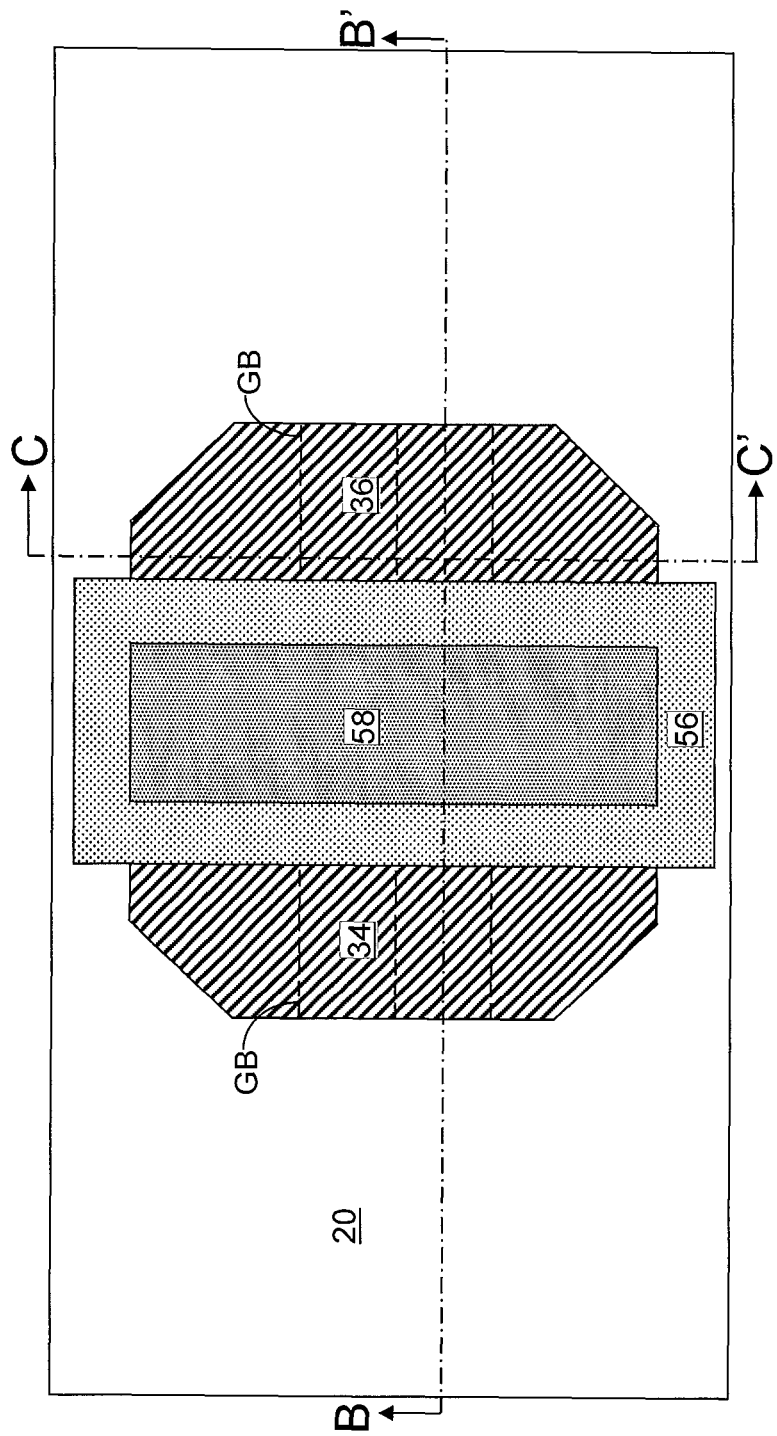
FIG. 8A is a top-down view of the exemplary semiconductor structure after formation of a source region and a drain region according to an embodiment of the present disclosure.
Figure 8B:
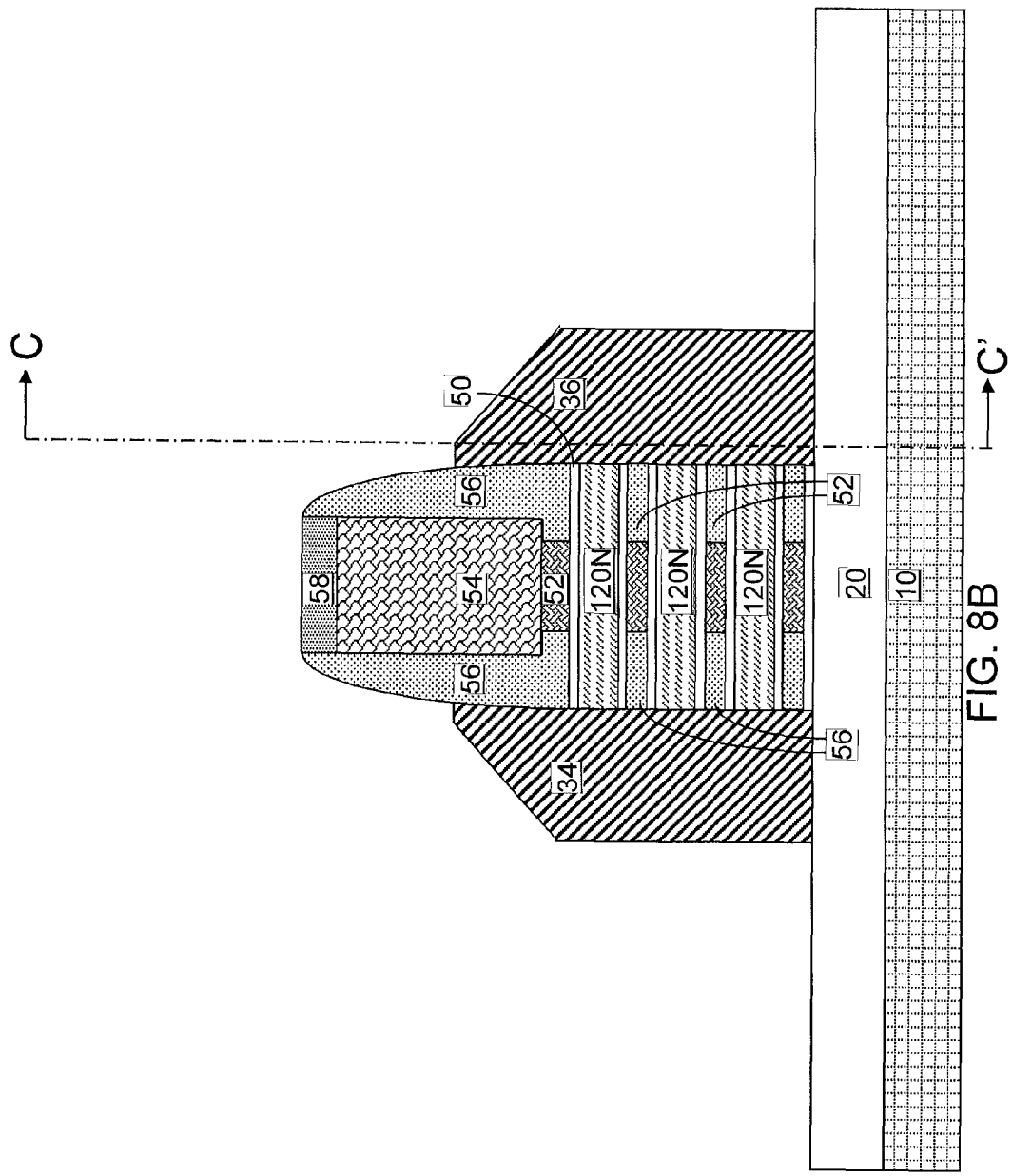
FIG. 8B is a vertical cross-sectional view of the exemplary semiconductor structure along the vertical plane B-B' of FIG. 8A.

Referring to FIGS. 8A-8C, a source region 34 and a drain region 36 can be formed by depositing a semiconductor material on physically exposed end surfaces of remaining portions of the semiconductor nanowires 120N. In one embodiment, selective epitaxy of a semiconductor material can be performed such that the semiconductor material is deposited only on semiconductor surfaces and does not grow from insulator surfaces. Any semiconductor selective epitaxy process known in the art can be employed. The source region 34 and the drain region 36 are doped with electrical dopants, which can be p-type dopants or n-type dopants. If the plurality of semiconductor nanowires 120N is doped with dopants of a first conductivity type, the source region 34 and the drain region 36 are doped with dopants of a second conductivity type, which is the opposite of the first conductivity type. If the first conductivity type is p-type, the second conductivity type is n-type, and vice versa.

The doping of the source region 34 and the drain region 36 can be performed by in-situ doping, i.e., during deposition of the source region 34 and the drain region 36, or by ex-situ doping, i.e., after deposition of the source region 34 and the drain region 36. Exemplary methods for performing the ex-situ doping include, but are not limited to, ion implantation, plasma doping, and outdiffusion of dopants from a disposable dopant-including material that is temporarily deposited and subsequently removed.

The plurality of semiconductor nanowires 120N collectively functions as a body of a field effect transistor, and is herein referred to as nanowire body regions. Each semiconductor nanowire 120N is a nanowire body region. The source region 34 functions as the source of the field effect transistor, and the drain region 36 functions as the drain of the field effect transistor.

In one embodiment, the plurality of semiconductor nanowires 120N can be a plurality of single crystalline semiconductor nanowires, and the source region 34 and the drain region 36 can be formed by selective epitaxy such that the source region 34 and the drain region 36 are in epitaxial alignment with the plurality of single crystalline semiconductor nanowires.

Each of the source region 34 and the drain region 36 includes a doped semiconductor material, and is in contact with first end surfaces of the plurality of semiconductor nanowires 120N, an outer sidewalls surface of the gate spacer 56, and a top surface of the insulator layer 20. In one embodiment, each of the plurality of semiconductor nanowires 120N can be single crystalline, and can be in epitaxial alignment with a portion of the source region 34 and a portion of the drain region 36.

In one embodiment, grain boundaries GB can be formed as the deposited semiconductor material that nucleates on different semiconductor nanowires 120N merge to form the source region 34 or the drain region 36. In one embodiment, each of the source region 34 and the drain region 36 can include at least one horizontal grain boundary and at least one vertical grain boundary.

Figure 9A:
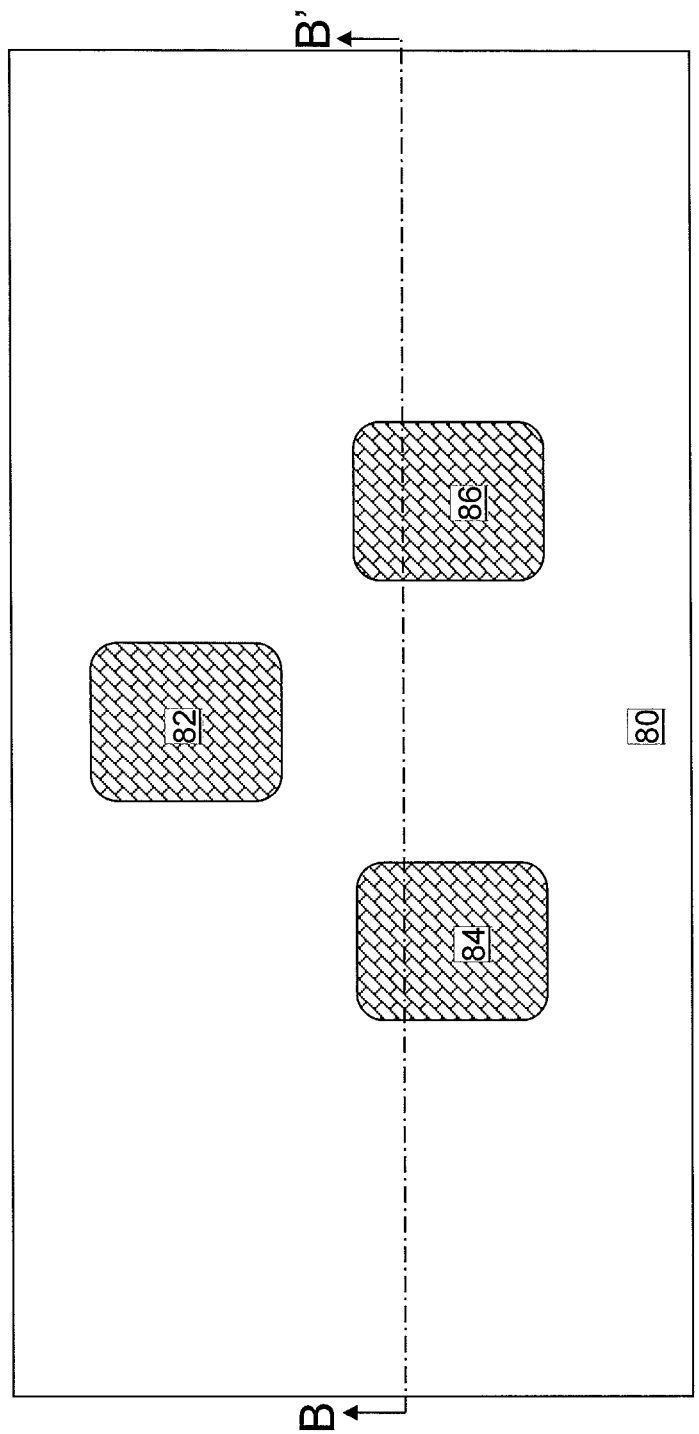
FIG. 9A is a top-down view of the exemplary semiconductor structure after formation of a contact level dielectric layer and contact via structures according to an embodiment of the present disclosure.
Figure 9B:
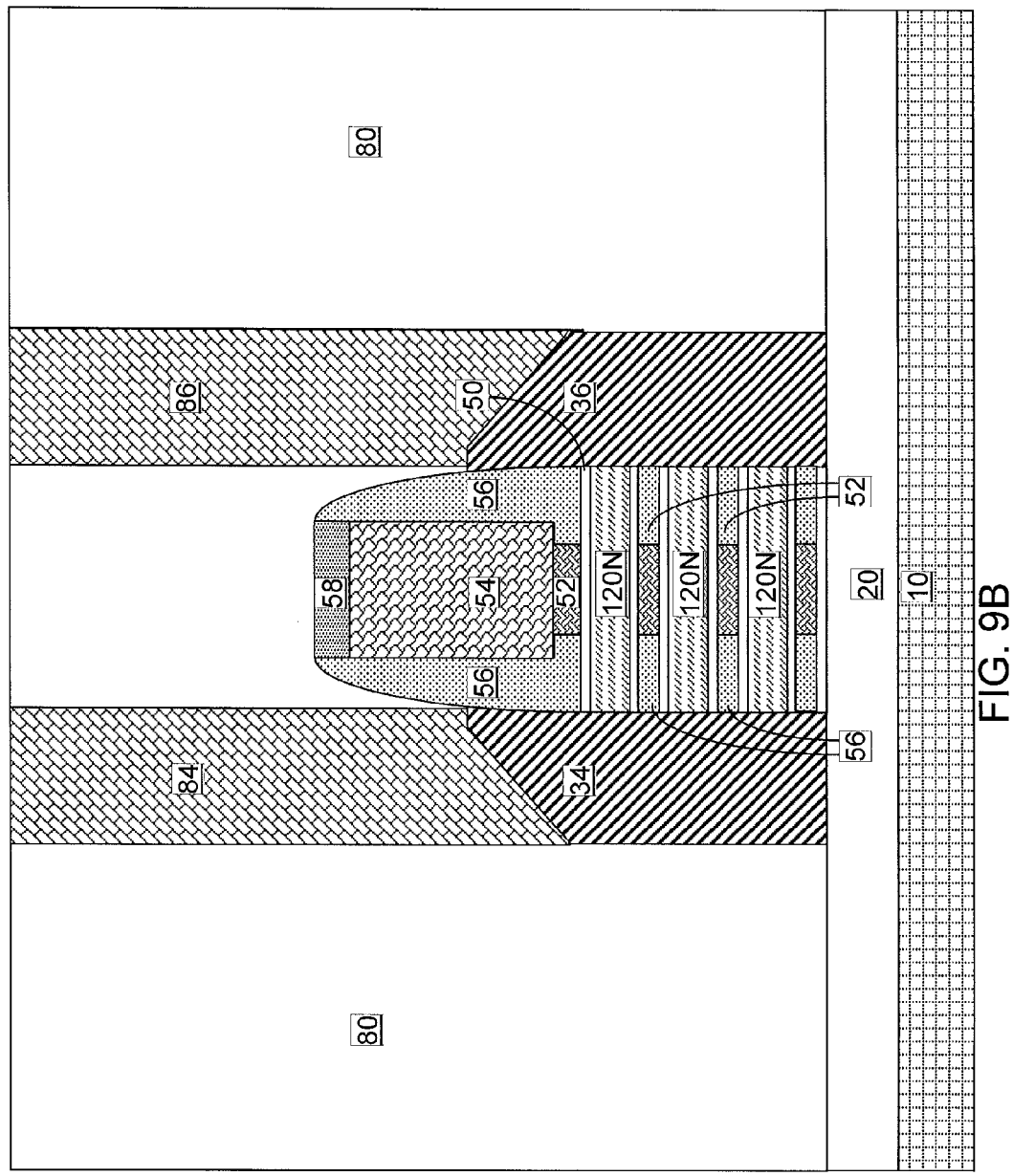
FIG. 9B is a vertical cross-sectional view of the exemplary semiconductor structure along the vertical plane B-B' of FIG. 9A.

Referring to FIGS. 9A and 9B, a contact level dielectric layer 80 and various contact via structures (82, 84, 86) can be formed to provide electrical contact to the source region 34, the drain region 36, and the gate electrode (52, 54).

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
 a plurality of semiconductor nanowires spaced from a top surface of a substrate by different distances and extending along a lengthwise direction;
 a plurality of gate dielectrics contacting all lengthwise surfaces of said plurality of semiconductor nanowires that extend along said lengthwise direction;
 a gate electrode contacting said plurality of gate dielectrics and laterally surrounding each semiconductor nanowire that is not in contact with said substrate and is included among said plurality of semiconductor nanowires;
 a gate spacer in physical contact with sidewall surfaces of said gate electrode; and
 at least one doped semiconductor material portion in contact with said plurality of semiconductor nanowires, wherein all interfaces between each of said at least one doped semiconductor material portion and said plurality of semiconductor nanowires are vertically coincident with sidewalls of said gate spacer.

2. The semiconductor structure of claim 1, wherein each of said plurality of semiconductor nanowires has a cylindrical shape with a cross-sectional shape bounded by convex surfaces.

3. The semiconductor structure of claim 1, wherein said gate spacer is in physical contact with all sidewall surfaces of said gate electrode.

4. The semiconductor structure of claim 1, wherein said gate electrode laterally surrounds all of said plurality of semiconductor nanowires that are not in physical contact with said substrate.

5. The semiconductor structure of claim 1, wherein said at least one doped semiconductor material portion comprises:
 a source region comprising a semiconductor material and in contact with first end surfaces of said plurality of semiconductor nanowires; and
 a drain region comprising said semiconductor material and in contact with second end surfaces of said plurality of semiconductor nanowires.

6. The semiconductor structure of claim 5, wherein each of said plurality of semiconductor nanowires is single crystalline, and is in epitaxial alignment with a portion of said source region and a portion of said drain region.

7. The semiconductor structure of claim 5, wherein each of said source region and said drain region includes at least one horizontal grain boundary and at least one vertical grain boundary.

8. A semiconductor structure comprising:
 a plurality of semiconductor nanowires spaced from a top surface of a substrate by different distances and extending along a lengthwise direction;
 a plurality of gate dielectrics contacting all lengthwise surfaces of said plurality of semiconductor nanowires that extend along said lengthwise direction;
 a gate electrode contacting said plurality of gate dielectrics and laterally surrounding each semiconductor nanowire that is not in contact with said substrate and is included among said plurality of semiconductor nanowires; and
 a gate spacer in physical contact with sidewall surfaces of said gate electrode, wherein said gate electrode comprises a stack of a metallic gate electrode and a semiconductor gate electrode, wherein said metallic gate electrode has a lesser width than said semiconductor gate electrode.

9. The semiconductor structure of claim 8, wherein said metallic gate electrode is in contact with said plurality of gate dielectrics, and said semiconductor gate electrode is not in contact with any of said plurality of gate dielectrics.

10. The semiconductor structure of claim 8, wherein a surface of said gate spacer is in physical contact with a bottom surface of said semiconductor gate electrode.

11. The semiconductor structure of claim 8, further comprising at least one doped semiconductor material portion in contact with said plurality of semiconductor nanowires, wherein all interfaces between each of said at least one doped semiconductor material portion and said plurality of semiconductor nanowires are vertically coincident with sidewalls of said gate spacer.

12. The semiconductor structure of claim 8, wherein each of said plurality of semiconductor nanowires has a cylindrical shape with a cross-sectional shape bounded by convex surfaces.

13. The semiconductor structure of claim 8, wherein end surfaces of said plurality of semiconductor nanowires are vertically coincident with vertical portions of outer sidewalls of said gate spacer.

14. The semiconductor structure of claim 8, wherein said gate spacer is in physical contact with all sidewall surfaces of said gate electrode.

15. The semiconductor structure of claim 8, wherein said gate electrode laterally surrounds all of said plurality of semiconductor nanowires that are not in physical contact with said substrate.

16. A semiconductor structure comprising:
 a plurality of semiconductor nanowires spaced from a top surface of a substrate by different distances and extending along a lengthwise direction;
 a plurality of gate dielectrics contacting all lengthwise surfaces of said plurality of semiconductor nanowires that extend along said lengthwise direction;
 a gate electrode contacting said plurality of gate dielectrics and laterally surrounding each semiconductor nanowire that is not in contact with said substrate and is included among said plurality of semiconductor nanowires; and
 a gate spacer in physical contact with sidewall surfaces of said gate electrode, wherein end surfaces of said plurality of semiconductor nanowires are vertically coincident with vertical portions of outer sidewalls of said gate spacer.

17. The semiconductor structure of claim 16, wherein each of said plurality of semiconductor nanowires has a cylindrical shape with a cross-sectional shape bounded by convex surfaces.

18. The semiconductor structure of claim 16, wherein a surface of said gate spacer is in physical contact with a bottom surface of said semiconductor gate electrode.

19. The semiconductor structure of claim 16, wherein said gate spacer is in physical contact with all sidewall surfaces of said gate electrode.

20. The semiconductor structure of claim 16, wherein said gate electrode laterally surrounds all of said plurality of semiconductor nanowires that are not in physical contact with said substrate.

* * * * *